United States Patent
Wierzchowiec et al.

(10) Patent No.: US 9,490,439 B2
(45) Date of Patent: Nov. 8, 2016

(54) PLANARIZATION LAYER FOR ORGANIC ELECTRONIC DEVICES

(71) Applicants: Merck Patent GmbH, Darmstadt (DE); Promerus LLC, Brecksville, OH (US)

(72) Inventors: Piotr Wierzchowiec, Southampton (GB); Tomas Backlund, Southampton (GB); Li W. Tan, Eastleigh (GB); Irina Afonina, Southampton (GB); Pawel Miskiewicz, Cambridge, MA (US); Paul C. Brookes, Acton, MA (US); Larry F. Rhodes, Silver Lake, OH (US); Andrew Bell, Lakewood, OH (US)

(73) Assignees: Merck Patent GmbH, Darmstadt (DE); Promerus, LLC, Brecksville, OH (US)

( * ) Notice: Subject to any disclaimer, the term of this patent is extended or adjusted under 35 U.S.C. 154(b) by 0 days.

(21) Appl. No.: 14/936,923

(22) Filed: Nov. 10, 2015

(65) Prior Publication Data

US 2016/0079551 A1    Mar. 17, 2016

Related U.S. Application Data

(63) Continuation of application No. 13/767,435, filed on Feb. 14, 2013, now abandoned.

(60) Provisional application No. 61/599,069, filed on Feb. 15, 2012.

(30) Foreign Application Priority Data

Feb. 15, 2012    (EP) .................................... 12000974

(51) Int. Cl.
*H01L 35/24* (2006.01)
*H01L 51/10* (2006.01)
(Continued)

(52) U.S. Cl.
CPC .......... *H01L 51/107* (2013.01); *C08F 232/08* (2013.01); *H01L 51/0001* (2013.01);
(Continued)

(58) Field of Classification Search
CPC ............ H01L 51/107; H01L 51/0094; H01L 51/0035
USPC .......................................... 257/40, E51.001
See application file for complete search history.

(56) References Cited

U.S. PATENT DOCUMENTS

| | | |
|---|---|---|
| 5,976,703 A | 11/1999 | Nakata et al. |
| 2008/0237583 A1 | 10/2008 | Masuda |
| 2012/0056183 A1 | 3/2012 | Mueller et al. |

FOREIGN PATENT DOCUMENTS

| | | |
|---|---|---|
| CN | 103261250 | 8/2013 |
| JP | 2006098984 A | 4/2006 |

(Continued)

OTHER PUBLICATIONS

English Translation of Office Action CN 201380008858.6 dated Apr. 13, 2016.

(Continued)

*Primary Examiner* — Anthony Ho
(74) *Attorney, Agent, or Firm* — Drinker Biddle & Reath LLP

(57) ABSTRACT

The invention relates to organic electronic devices containing polycycloolefin planarization layers between the substrate and a functional layer such as a semiconducting layer, dielectric layer, or electrode; to the use of polycycloolefins as a planarization layer on the substrate of an organic electronic device; and to processes for preparing such polycycloolefin planarization layers and organic electronic devices.

28 Claims, 7 Drawing Sheets

(51) Int. Cl.
*H01L 51/00* (2006.01)
*C08F 232/08* (2006.01)
*H01L 51/05* (2006.01)

(52) U.S. Cl.
CPC ....... *H01L51/0012* (2013.01); *H01L 51/0035* (2013.01); *H01L 51/0094* (2013.01); *H01L 51/0096* (2013.01); *H01L 51/0508* (2013.01); *C08G 2261/418* (2013.01); *H01L 51/0034* (2013.01); *H01L 51/0541* (2013.01); *H01L 51/0545* (2013.01); *Y02E 10/549* (2013.01); *Y02P 70/521* (2015.11)

(56) References Cited

FOREIGN PATENT DOCUMENTS

| WO | WO 2009052085 A1 | 4/2009 |
| WO | WO 2009097377 A1 | 8/2009 |
| WO | WO 2010057585 | 5/2010 |
| WO | WO 2011151456 | 12/2011 |

OTHER PUBLICATIONS

International Search Report for PCT/EP2013/000255 dated May 7, 2013.

MacDonald, W.A., et al., "Latest Advances in Substrates for Flexible Electronics", Journal of the SID, vol. 15, No. 12, (2007), pp. 1075-1083.

Tanglumlert, Walairat, et al., "Hard-Coating Materials for Poly(Methyl Methacrylate) from Glycidoxypropyltrimethoxysilane-Modified Silatrane via a Sol-Gel Process", Surface & Coatings Technology, vol. 200, (2006), pp. 2784-2790.

PLANARIZATION LAYER FOR ORGANIC ELECTRONIC DEVICES

CROSS-REFERENCE TO RELATED APPLICATIONS

This application is a continuation of U.S. application Ser. No. 13/787,435, which was filed on Feb. 14, 2013, and which claims benefit to U.S. Provisional Application No. 61/599,069, filed on Feb. 15, 2012, and EP Application No. 12000974.1, filed Feb. 15, 2012, each application of which is incorporated herein by reference in their entirety.

TECHNICAL FIELD

Embodiments in accordance with the present invention relate to organic electronic devices comprising polycycloolefin planarization layers, and more particularly to planarization layers positioned between the substrate and a functional layer, e.g. a semiconducting layer, a dielectric layer or an electrode, and further to the use of such a planarization layer in organic electronic devices, and to processes for preparing such polycycloolefin planarization layers and organic electronic devices.

BACKGROUND

In recent years there has been growing interest in organic electronic (OE) devices, for example field effect transistors for use in display devices and logic capable circuits, or organic photovoltaic (OPV) devices. A conventional organic field effect transistor (OFET) typically includes source, drain and gate electrodes, a semiconducting layer made of an organic semiconductor (OSC) material, and an insulator layer (also referred to as "dielectric" or "gate dielectric"), made of a dielectric material and positioned between the OSC layer and the gate electrode.

A broad range of different substrates can be used for OE devices like OFETs and OPVs. The most common are polymers like polyethylene terephthalate (PET), polyethylene naphthalate (PEN), other polyesters, polyimide, polyacrylate, polycarbonate, polyvinylalcohol, polycycloolefin or polyethersulphone. Thin metal films, paper based substrates, glass and others are also available.

However, the substrates that have hitherto been available often contain defects and contamination from the production process. Therefore, for the purpose of integrity of the thin-film OE devices made on top of them, most of these substrates require an additional planarization or barrier layer in order to provide a smooth and defect-free surface.

Further reasons or functions requiring the application of an intermediate layer between substrate and OSC material include: 1) improving the hardness/scratch resistance of the substrate, 2) providing electrical isolation of the substrate and the OSC layer, 3) providing a barrier to prevent diffusion of metal ions, small molecules, and oligomers from the carrier substrate to OSC, 4) modifying wetting properties of the substrate, and 5) acting as adhesion promoter.

Various plastic film substrates are commercially available, like for example PET films of the Melinex® series or PEN films of the Teonex® series, both from DuPont Teijin Films™.

Typical commercially available planarization, hard-coating, or barrier materials include:

1) Silicon dioxide ($SiO_2$) or silicon nitride (SiNX) electrical insulators, which are used mainly on top of conducting metal substrates.

2) Organic polymers, such as, acrylic-, melamine- or urethane-based polymers.

3) Organic-inorganic hybrid composites, which are based mainly on the use of metal alkoxide and organosiloxane via sol-gel processing, as disclosed for example in U.S. Pat. No. 5,976,703 or in W. Tanglumlert et al. 'Hard-coating materials for poly(methyl methacrylate) from glycidoxypropyl-trimethoxysilane-modified silatrane via sol-gel process', Surface & Coatings Technology 200 (2006) p. 2784.

Nevertheless, to date there has been no planarization material which fulfills all requirements for all the commercially available OE/OPV materials. Two of the major weaknesses of the currently available materials are: 1) a low surface energy, which causes de-wetting of OSC materials during coating, therefore requiring additional pre-treatment, and 2) a high permeation of the available polymers and composites to water. Therefore, the above-mentioned materials are not suitable for many OE/OPV applications unless an additional barrier or surface modification layer is applied.

Moreover, the inventors have found that the planarization materials used in commercially available PET or PEN substrates have turned out not to be fully compatible with recently developed high performance OSC materials, like those of the Lisicon® Series (commercially available from Merck KGaA or Merck Chemicals Ltd.). Further, poor electrical stability of devices using the Lisicon® Series OSC directly on top of planarised Melinex® and Teonex® has been observed. Therefore, an additional barrier/surface modification layer on top of the existing planarization layer, or a replacement for the planarization layer would be advantageous.

In general, a planarization material should exhibit one or more of the following characteristics:

1). acting as an electrical insulator,
2). providing a smooth surface (preferably arithmetic average roughness of absolute values (Ra)<5 and maximum high of the profile (Rt)<50),
3). providing for the electrical performance and stability of OTFTs compared to the best working example on any other substrate,
4). enabling good adhesion between the substrate and electrode metals (preferably 5N/cm or higher),
5). possessing good wetting properties for OSC formulations (preferably a surface energy of the planarization layer ≥50 mN/m),
6). inherent resistance to process chemicals,
7). optical transparency in the visible spectrum,
8). deposition using well established industrial processes.

Therefore, there is still a need for improved planarization layers which can be used in OE devices, especially OFETs and OPV cells, which fulfill the above-mentioned requirements.

One aim of the present invention is to provide planarization layers meeting these requirements. Another aim is to provide improved OE/OPV devices comprising such planarization layers. Further aims are immediately evident to the person skilled in the art from the following description.

The inventors of the present invention have found these aims can be achieved by providing planarization layers and OE devices in accordance with the present invention and as claimed hereinafter.

SUMMARY OF THE INVENTION

Embodiments in accordance with the present invention encompass an organic electronic device overlying a substrate, the substrate having a planarization layer provided between the substrate and a functional layer, where the planarization layer encompasses a polycycloolefinic polymer and the functional layer is one of a semiconducting layer, a dielectric layer or an electrode.

Some embodiments in accordance with the present invention are also directed to the use of the aforementioned planarization layer in an organic electronic device. Still further, some embodiments are directed to a method of using a polycycloolefinic polymer in the fabrication of a planarization layer for an organic electronic device.

The aforementioned polycycloolefinic polymer is for example a norbornene-type polymer.

The aforementioned organic electronic device is for example an Organic Field Effect Transistor (OFET), which is inclusive of an Organic Thin Film Transistor (OTFT), a top gate OFET, a bottom gate OFET, an Organic Photovoltaic (OPV) Device or an Organic Sensor.

Embodiments of the present invention are also inclusive of a product or an assembly encompassing an organic electronic device as described above and below. Such product or assembly being an Integrated Circuit (IC), a Radio Frequency Identification (RFID) tag, a security marking or security device containing an RFID tag, a Flat Panel Display (FPD), a backplane of an FPD, or a sensor.

BRIEF DESCRIPTION OF THE DRAWINGS

Embodiments in accordance with the present invention are described below with reference to the following drawings.

DETAILED DESCRIPTION OF THE INVENTION

Figure 1:
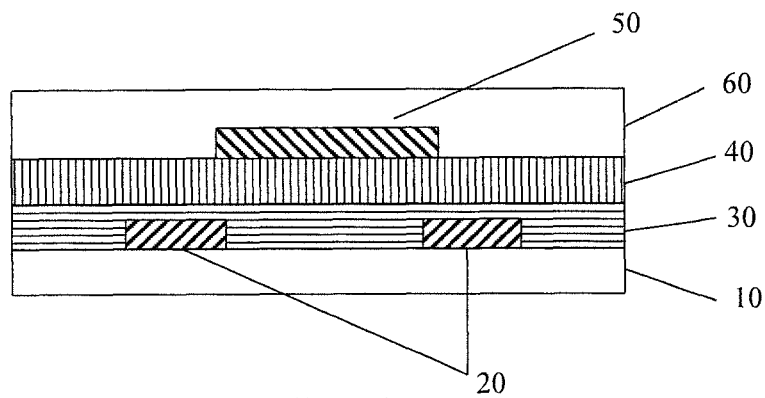
FIG. 1 is a schematic representation of a top gate OFET device according to prior art.

Exemplary embodiments in accordance with the present invention will be described with reference to the Examples and Claims provided hereinafter. Various modifications, adaptations or variations of such exemplary embodiments described herein may become apparent to those skilled in the art as such are disclosed. It will be understood that all such modifications, adaptations or variations that rely upon the teachings of the present invention, and through which these teachings have advanced the art, are considered to be within the scope of the present invention.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the Exhibits and Claims appended hereto, are subject to the various uncertainties of measurement encountered in obtaining such values, unless otherwise indicated, all are to be understood as modified in all instances by the term "about."

Where a numerical range is disclosed herein, unless otherwise specified, such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all subranges subsumed therein. For example, a stated range of from "1 to 10" should be considered to include any and all subranges between the minimum value of 1 and the maximum value of 10. Exemplary subranges of the range 1 to 10 include, but are not limited to, 1 to 6.1, 3.5 to 7.8, and 5.5 to 10.

Advantageously, the polycycloolefinic or norbornene-type polymers used in the planarization layers of the present invention are tailorable to overcome the drawbacks that have been observed in previously known planarization materials, such as poor electrical stability of the OSC in contact with the planarization layer, low surface energy which causes de-wetting of the OSC material during coating.

Moreover, the planarization layers comprising polycycloolefinic polymers show improved adhesion to the substrate and to electrodes, reduced surface roughness, and improved OSC performance.

The planarization layers comprising polycycloolefinic polymers allow for time-, cost- and material-effective production of OFETs employing organic semiconductor materials and organic dielectric materials on a large scale.

Further, as will be discussed, the polycycloolefinic or norbornene-type polymers can, in combination with the substrate and/or with functional layers like the organic dielectric layer or the OSC layer, provide improved surface energy, adhesion and structural integrity of such combined layers in comparison with planarization materials of prior art that have been employed in such OFETs.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the term "polymer composition" means at least one polymer and one or more other materials added to the at least one polymer to provide, or to modify, specific properties of the polymer composition and or the at least one polymer therein. It will be understood that a polymer composition is a vehicle for carrying the polymer to a substrate to enable the forming of layers or structures thereon. Exemplary materials include, but are not limited to, solvents, antioxidants, photoinitiators, photosensitizers, crosslinking moieties or agents, reactive diluents, acid scavengers, leveling agents and adhesion promoters. Further, it will be understood that a polymer composition may, in addition to the aforementioned exemplary materials, also encompass a blend of two or more polymers.

As defined herein, the terms "polycycloolefin", "polycyclic olefin", and "norbornene-type" are used interchangeably and refer to addition polymerizable monomers, or the resulting repeating unit, encompassing at least one norbornene moiety such as shown by either Structure A1 or A2, below. The simplest norbornene-type or polycyclic olefin monomer bicyclo[2.2.1]hept-2-ene (A1) is commonly referred to as norbornene.

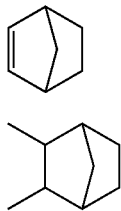

(A1)

(A2)

However, the term "norbornene-type monomer" or "norbornene-type repeating unit", as used herein, is understood to not only mean norbornene itself but also to refer to any substituted norbornene, or substituted and unsubstituted higher cyclic derivatives thereof, for example of Structures B1 and B2, shown below, wherein m is an integer greater than zero.

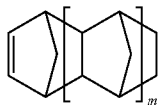

(B1)

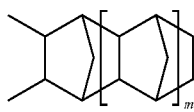

(B2)

By the substitution of a norbornene-type monomer with a pendant group, the properties of a polymer formed therefrom can be tailored to fulfill the needs of individual applications. The procedures and methods that have been developed to polymerize functionalized norbornene-type monomers exhibit an outstanding flexibility and tolerance to various moieties and groups of the monomers. In addition to polymerization of monomers with a specific pendant group, monomers having a variety of distinct functionalities can be randomly polymerized to form a final material where the types and ratios of monomers used dictate the overall bulk properties of the resulting polymer.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, or I). The term perhalocarbyl refers to a hydrocarbyl group where each hydrogen has been replaced by a halogen. Non-limiting examples of hydrocarbyls, include, but are not limited to a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to vinyl, propenyl, butenyl and hexenyl. Representative alkynyl groups include but are not limited to ethynyl, 1-propynyl, 2-propynyl, 1 butynyl, and 2-butynyl. Representative cycloalkyl groups include but are not limited to cyclopentyl, cyclohexyl, and cyclooctyl substituents. Representative aryl groups include but are not limited to phenyl, biphenyl, naphthyl, and anthracenyl. Representative aralkyl groups include but are not limited to benzyl, phenethyl and phenbutyl.

The term "halohydrocarbyl" as used herein is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation. The term "perhalohydrocarbyl"=as used herein is inclusive of the hydrocarbyl moieties mentioned above but where all the hydrogen atom being replaced by a halogen atom. For example, halogenated alkyl groups that can be useful in embodiments of the present invention can be partially or fully halogenated, alkyl groups of the formula $C_aX_{2a+1}$ wherein X is independently a halogen or a hydrogen and a is selected from an integer of 1 to 25. In some embodiments each X is independently selected from hydrogen, chlorine, fluorine bromine and/or iodine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms "hydrocarbyl", "halohydrocarbyl", and "perhalohydrocarbyl", are inclusive of moieties where one or more of the carbons atoms is replaced by a heteroatom selected independently from O, N, P, or Si. Such heteroatom containing moieties can be referred to as, for example, either "heteroatom-hydrocarbyls" or "heterohydrocarbyls", including, among others, ethers, epoxies, glycidyl ethers, alcohols, carboxylic acids, esters, maleimides, amines, imines, amides, phenols, amidophenols, silanes, siloxanes, phosphines, phosphine oxides, phosphinites, phosphonites, phosphites, phosphonates, phosphinates, and phosphates.

Further exemplary hydrocarbyls, halohydrocarbyls, and perhalocarbyls, inclusive of heteroatoms, include, but are not limited to, —$(CH_2)_n$—Ar—$(CH_2)_n$—$C(CF_3)_2$—OH, —$(CH_2)_n$—Ar—$(CH_2)_n$—$OCH_2C(CF_3)_2$—OH, —$(CH_2)_n$—$C(CF_3)_2$—OH, —$((CH_2)_i$—O—$)_k$—$(CH_2)$—$C(CF_3)_2$—OH, —$(CH_2)_n$—$C(CF_3)(CH_3)$—OH, —$(CH_2)_n$—$C(O)NHR^*$, —$(CH_2)_n$—$C(O)Cl$, —$(CH_2)_n$—$C(O)OR^*$, —$(CH_2)_n$—$OR^*$, —$(CH_2)_n$—$OC(O)R^*$ and —$(CH_2)_n$—$C(O)R^*$, where n independently represents an integer from 0 to 12, i is 2, 3 or 4, k is 1, 2 or 3, Ar is aryl, for example phenyl, and R* independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl.

Exemplary perhalogenated alkyl groups include, but are not limited to, trifluoromethyl, trichloromethyl, —$C_2F_5$, —$C_3F_7$, —$C_4F_9$, —$C_6F_{13}$, —$C_7F_{15}$, and —$C_{11}F_{23}$. Exemplary halogenated or perhalogenated aryl and aralkyl groups include, but are not limited to, groups having the formula —$(CH_2)_x$—$C_6F_yH_{5-y}$, and —$(CH_2)_x$—$C_6F_yH_{4-y-p}C_zF_qH_{2z+1-q}$, where x, y, q and z are independently selected integers from 0 to 5, 0 to 5, 0 to 9 and 1 to 4, respectively. Specifically, such exemplary halogenated or perhalogenated aryl groups include, but are not limited to, pentachlorophenyl, pentafluorophenyl, pentafluorobenzyl, 4-trifluoromethylbenzyl, pentafluorophenethyl, pentafluorophenpropyl, and pentafluorophenbutyl.

In some polymer embodiments in accordance with the invention, the norbornene-type polymer incorporates two or more distinct types of repeating units.

In other polymer embodiments in accordance with the invention, the norbornene-type polymer incorporates one or more distinct types of repeating units, where at least one such type of repeating unit encompasses pendant crosslinkable groups or moieties that have some degree of latency. By "latency", it is meant that such groups do not crosslink at ambient conditions or during the initial forming of the polymers, but rather crosslink when such reactions are specifically initiated, for example by actinic radiation or heat. Such latent crosslinkable groups are incorporated into the polymer backbone by, for example, providing one or more norbornene-type monomers encompassing such a pendant crosslinkable group, for example, a substituted or unsubstituted maleimide or maleimide containing pendant group, to the polymerization reaction mixture and causing the polymerization thereof. Other examples of crosslinkable groups encompass a group comprising a substituted or unsubstituted maleimide portion, an epoxide portion, a vinyl portion, an acetylene portion, an indenyl portion, a cinnamate portion or a coumarin portion, and more specifically a group selected from a 3-monoalkyl- or 3,4-dialkylmaleimide, epoxy, vinyl, acetylene, cinnamate, indenyl or coumarin group.

Other polymer embodiments in accordance with the invention contain one or more norbornene-type polymers having one or more distinct types of repeating units of formula I

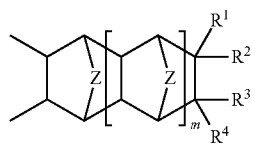

(I)

wherein Z is selected from —$CH_2$—, —$CH_2$—$CH_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group.

The repeating units of Formula I are formed from the corresponding norbornene-type monomers of Formula Ia where Z, m and $R^1$-$R^4$ are as defined above:

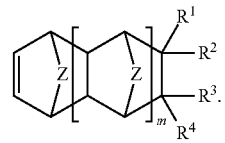

(Ia)

For some polymer embodiments in accordance with the present invention, for the repeating units and monomers of Formula I and Ia, Z is —$CH_2$— and m is 0, 1 or 2. For other such polymer embodiments Z is —$CH_2$— and m is 0 or 1, and for still other embodiments, Z is —$CH_2$— and m is 0.

Some embodiments of the invention encompass an organic electronic device overlying a substrate, the substrate having a planarization layer provided between the substrate and a functional layer, where the planarization layer encompasses a polymer composition that comprises a polycycloolefinic polymer, and the functional layer is one of a semiconducting layer, a dielectric layer or an electrode.

Polymer composition embodiments in accordance with the invention encompass either a single norbornene-type polymer or a blend of two or more different norbornene-type polymers. Where such polymer composition embodiments encompass a single norbornene-type polymer, such polymer can be a homopolymer, that is to say a polymer encompassing only one type of repeating unit, or a copolymer, that is to say a polymer encompassing two or more distinct types of repeating units. Where such polymer composition embodiments encompass a blend of different polymers, "different" is understood to mean that each of the blended polymers encompasses at least one type of repeating unit, or combination of repeating units, that is distinct from any of the other blended polymers.

Other polymer composition embodiments of the invention encompass a blend of two or more different norbornene-type polymers, wherein each polymer comprises one or more distinct types of repeating units of formula I

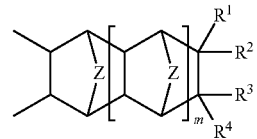

(I)

wherein Z is selected from —$CH_2$—, —$CH_2$—$CH_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group.

The polymer and polymer composition embodiments of the present invention can advantageously be tailored to provide a distinct set of properties for each of many specific applications. That is to say that different combinations of norbornene-type monomers with several different types of pendant groups can be polymerized to provide norbornene-type polymers having properties that provide for obtaining control over properties such as flexibility, adhesion, dielectric constant, and solubility in organic solvents, among others. For example, varying the length of an alkyl pendant group can allow control of the polymer's modulus and glass transition temperature (Tg). Also, pendant groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy, dielectric constant and influence the orthogonality of the solution with respect to other materials.

Thus, in further embodiments of the present invention, in particular for such embodiments where only one of $R^{1-4}$ is different from H, one or more of $R^{1-4}$ denote a halogenated or perhalogenated aryl or aralkyl group including, but not limited to those of the formula $-(CH_2)_x-C_6F_yH_{5-y}$, and $-(CH_2)_x-C_6F_yH_{4-y-p}C_zF_qH_{2z+1-q}$, where x, y, q, and z are independently selected integers from 0 to 5, 0 to 5, 0 to 9, and 1 to 4, respectively, and "p" means "para". Specifically such formulae include, but are not limited to, trifluoromethyl, trichloromethyl, $-C_2F_5$, $-C_3F_7$, $-C_4F_9$, $C_6F_{13}$, $-C_7F_{15}$, $-C_{11}F_{23}$, pentachlorophenyl, pentafluorophenyl, pentafluorobenzyl, 4-trifluoromethylbenzyl, pentafluorophenylethyl, pentafluorophenpropyl, and pentafluorophenbutyl.

Further still, some embodiments of the present invention, in particular for such embodiments where only one of $R^{1-4}$ is different from H, encompass a group that is different from H that is a polar group having a terminal hydroxy, carboxy or oligoethyleneoxy moiety, for example a terminal hydroxyalkyl, alkylcarbonyloxy (for example, acetyl), hydroxy-oligoethyleneoxy, alkyloxy-oligoethyleneoxy or alkylcarbonyloxy-oligoethyleneoxy moiety, where "oligoethyleneoxy" is understood to mean $-(CH_2CH_2O)_s-$ with s being 1, 2 or 3; for example 1-(bicyclo[2.2.1]hept-5-en-2-yl)-2,5,8,11-tetraoxadodecane (NBTODD) where s is 3 and 5-((2-(2-methoxyethoxy)ethoxy)methyl)bicyclo[2.2.1]hept-2-ene (NBTON) where s is 2.

Further still, other embodiments of the present invention, in particular for such embodiments where only one of $R^{1-4}$ is different from H, encompass a group that is different from H that is a group having a pendant silyl group, for example a silyl group represented by $-(CH_2)_n-SiR^9_3$ where n is an integer from 0 to 12, and each $R^9$ independently represents halogen selected from the group consisting of chlorine, fluorine, bromine and iodine, linear or branched ($C_1$ to $C_{20}$)alkyl, linear or branched ($C_1$ to $C_{20}$)alkoxy, substituted or unsubstituted ($C_6$ to $C_{20}$)aryl, linear or branched ($C_1$ to $C_{20}$)alkyl carbonyloxy, substituted or unsubstituted ($C_6$ to $C_{20}$)aryloxy; linear or branched ($C_1$ to $C_{20}$) dialkylamido; substituted or unsubstituted ($C_6$-$C_{20}$) diarylamido; substituted or unsubstituted ($C_1$-$C_{20}$)alkylarylamido.

Yet further still, for such embodiments where only one of $R^{1-4}$ is different from H, some embodiments encompass a group that is either a photoreactive or a crosslinkable group. Photoreactive or crosslinkable groups encompass a linking portion L and a functional portion Fp. L denotes or comprises a group selected from $C_1$-$C_{12}$ alkyls, aralkyls, aryls or hetero atom analogs. Further Fp denotes or comprises one or more of a maleimide, a 3-monoalkyl- or 3,4-dialkylmaleimide, epoxy, vinyl, acetyl, cinnamate, indenyl or coumarin moiety, which is capable of a crosslinking or 2+2 crosslinking reaction.

As used herein, the phrase "photoreactive and/or crosslinkable", when used to describe certain pendant groups, will be understood to mean a group that is reactive to actinic radiation and as a result of that reactivity enters into a crosslinking reaction, or a group that is not reactive to actinic radiation but can, in the presence of a crosslinking activator, enter into a crosslinking reaction.

Exemplary repeating units that encompass a pendant photoreactive or crosslinkable group that are representative of Formula I are formed during polymerization from norbornene-type monomers that include, but are not limited to, those selected from the following formulae:

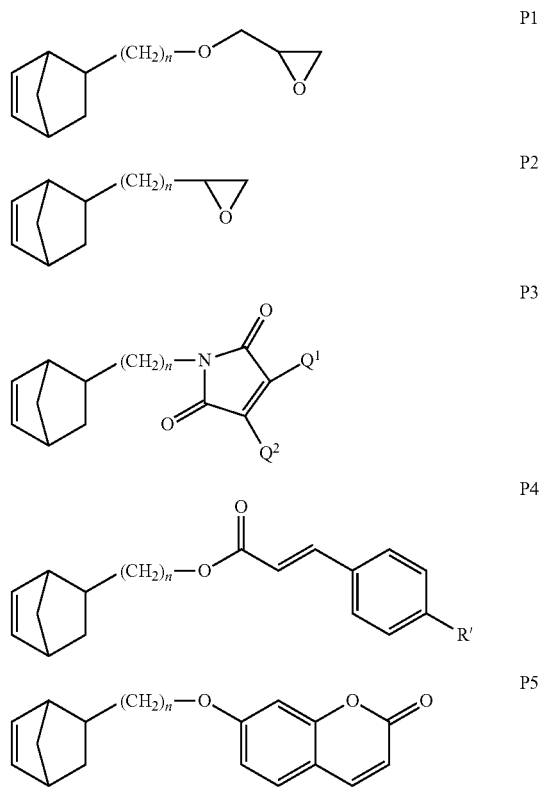

where n is an integer from 1 to 8, $Q^1$ and $Q^2$ are each independently from one another —H or —$CH_3$, and R' is —H or —$OCH_3$.

Further exemplary repeating units of Formula I such as described above are derived from one or more norbornene-type monomers represented by the following structural formulae 1 through 5 below:

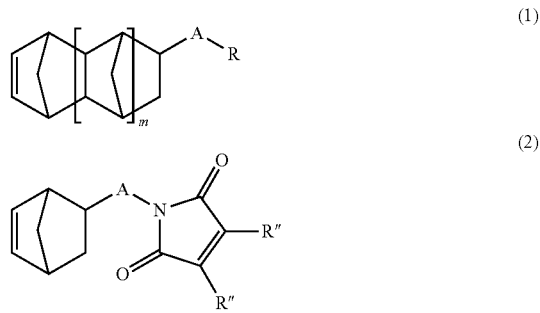

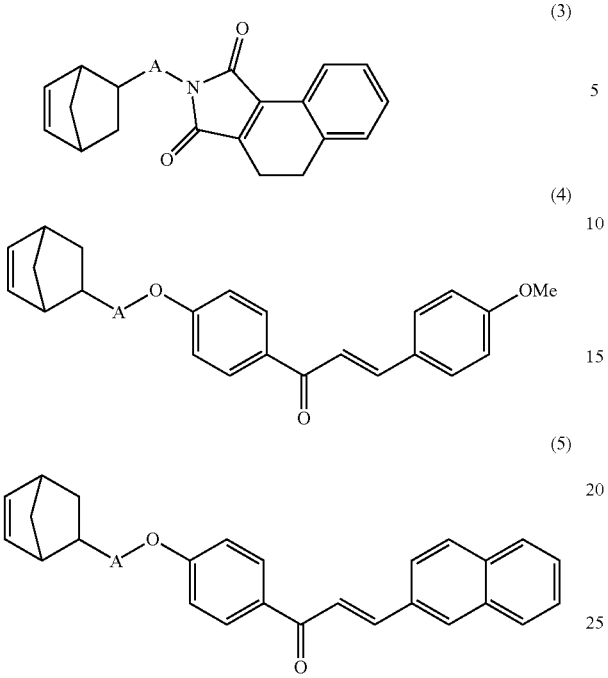

For structural formulae 1-5 above, m is an integer from 0 to 3, A is a connecting, spacer or bridging group selected from $(CZ_2)_n$, $(CH_2)_n$—$(CH=CH)_p$—$(CH_2)_n$, $(CH_2)_n$—O—$(CH_2)_n$, $(CH_2)_n$—$C_6Q_4$-$(CH_2)_n$, and for structure 1 additionally selected from $(CH_2)_n$—O and C(O)—O; R is selected from H, $CZ_3$, $(CZ_2)_nCZ_3$, OH, O—(O)$CCH_3$, $(CH_2CH_2O)_n$$CH_3$, $(CH_2)_n$—$C_6Q_5$, cinnamate or p-methoxy-cinnamate, coumarin, phenyl-3-indene, epoxide, C≡C—Si$(C_2H_5)_3$ or C≡C—Si(i-$C_2H_5)_3$, each n is independently an integer from 0 to 12, p is an integer from 1-6, $C_6Q_4$ and $C_6Q_5$ denote benzene that is substituted with Q, Q is independently H, F, $CH_3$, $CF_3$ or $OCH_3$, Z is independently H or F, with the proviso that -A-R does not contain an —O—O— (peroxy) linkage, and R" is independently H or $CH_3$.

Further exemplary repeating units represented by Formula I, as described above, are formed from one or more norbornene-type monomers that include, but are not limited to, those selected from the following formulae:

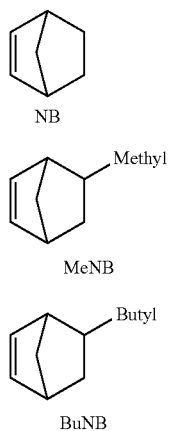

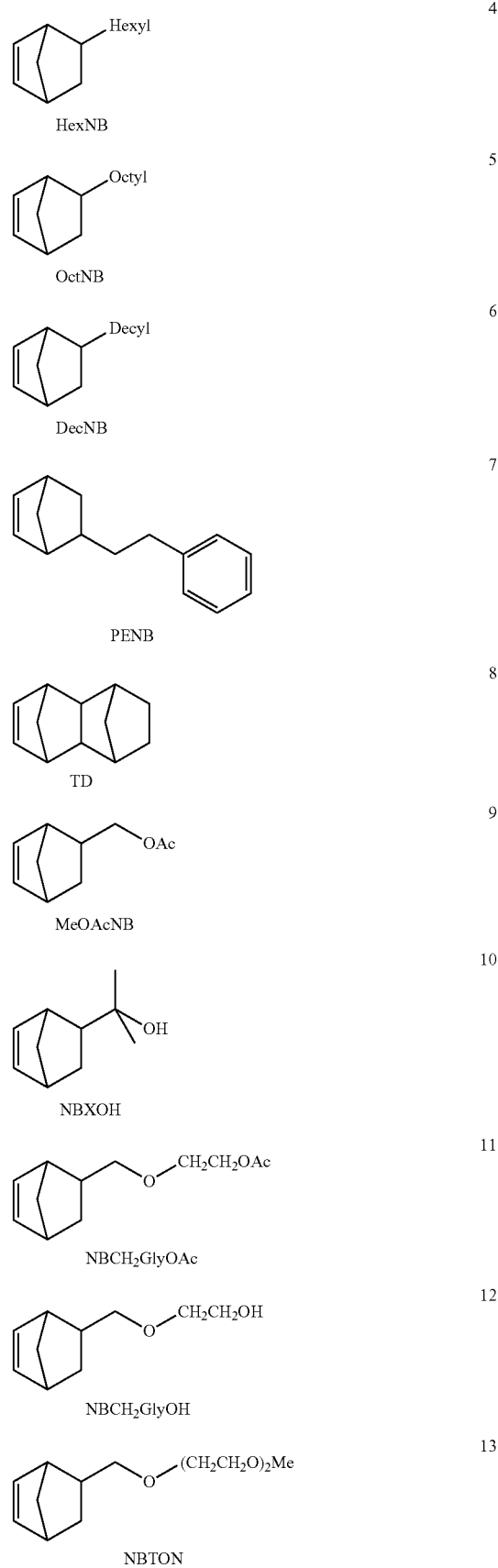

-continued
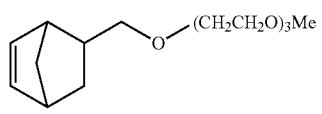
NBTODD
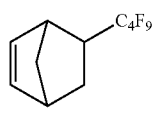
NBC4F9
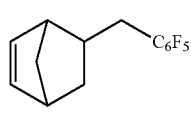
NBCH2C6F5
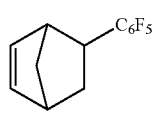
NBC6F5
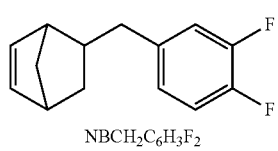
NBCH2C6H3F2
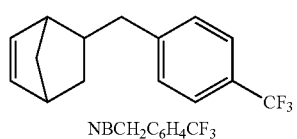
NBCH2C6H4CF3
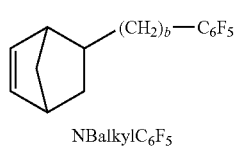
NBalkylC6F5
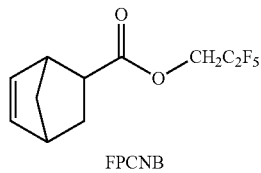
FPCNB
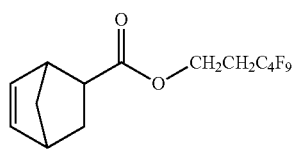
FHCNB
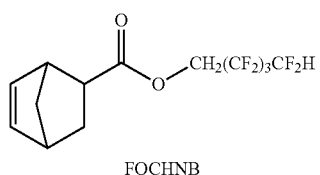
FOCHNB
-continued
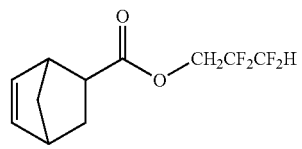
FPCHNB
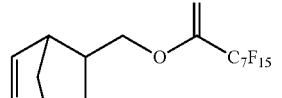
C7PFAcNB
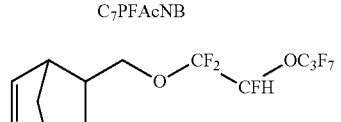
PPVENB
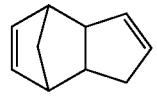
DCPD
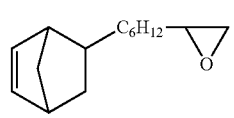
EONB
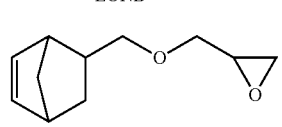
MGENB
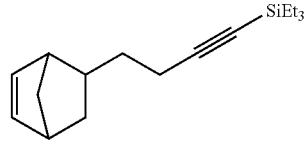
AkSiNB
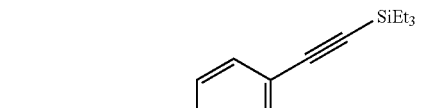
ArSiNB
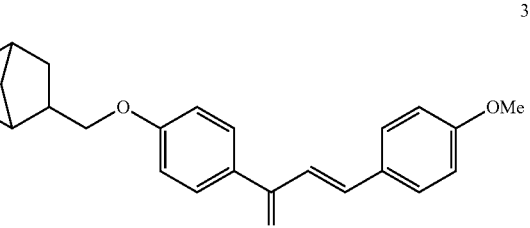
MCHMNB -continued
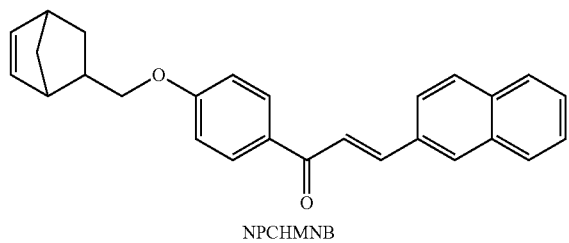
NPCHMNB
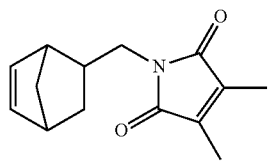
DMMIMeNB
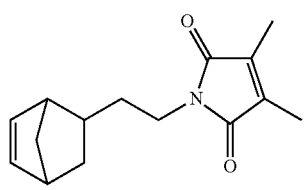
DMMIEtNB
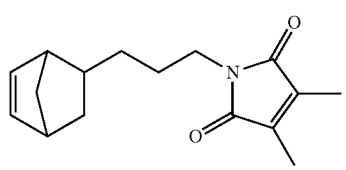
DMMIPrNB
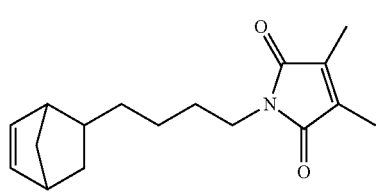
DMMIBuNB
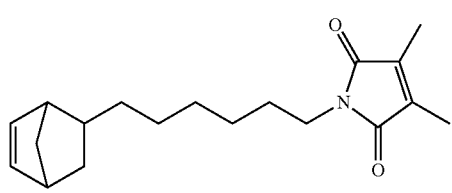
DMMIHxNB
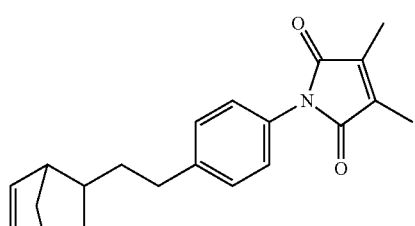
EtPhDMMINB
-continued
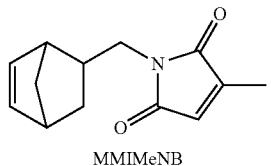
MMIMeNB
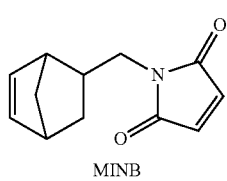
MINB
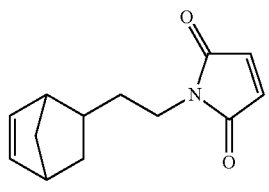
MIENB
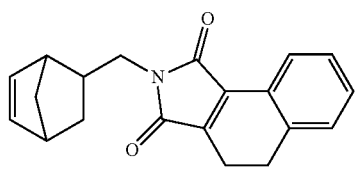
DHNMINB
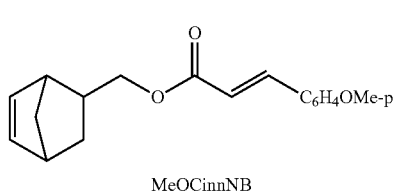
MeOCinnNB
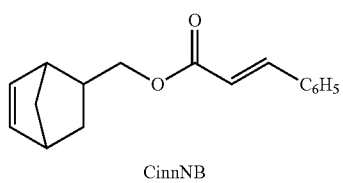
CinnNB
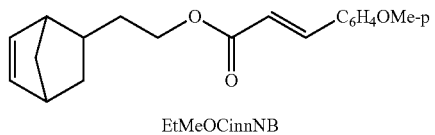
EtMeOCinnNB
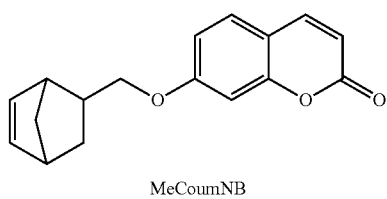
MeCoumNB -continued

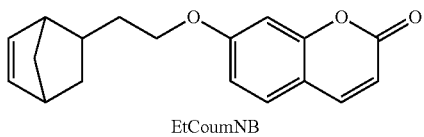
EtCoumNB

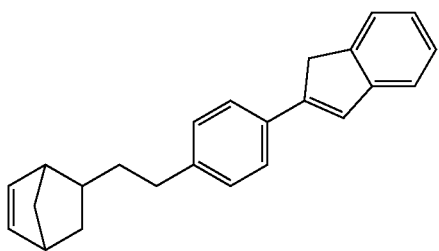
EtPhIndNB

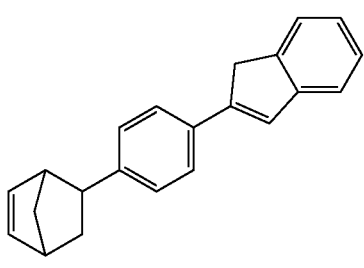
PhIndNB

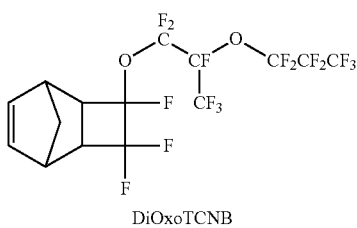
DiOxoTCNB

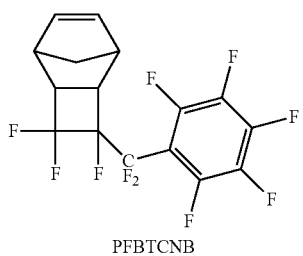
PFBTCNB

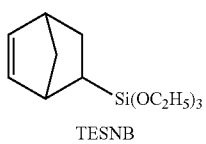
TESNB

TMSNB

-continued

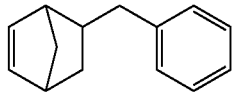
PMNB where "Me" means methyl, "Et" means ethyl, "OMe-p" means para-methoxy, "Ph" and "$C_6H_5$" mean phenyl, "$C_6H_4$" means phenylene, "$C_6F_5$" means pentafluorophenyl, in subformulae 9 and 11 "OAc" means acetate, in subformula 25 "PFAc" means —OC(O)—$C_7F_{15}$, and for each of the above subformulae having a methylene bridging group (a $CH_2$ covalently bonded to both the norbornene ring and a functional group), including but not limited to 11-14, 16, 18, 19 and 54, it will be understood that the methylene bridging group can be replaced by a covalent bond or —$(CH_2)_b$— as in formula 20, and b is an integer from 1 to 6.

It will be further noted that while 55 specific examples are provided above, other monomers in accordance with embodiments of the present invention are inclusive of monomers represented by formula Ia where at least one of $R^1$, $R^2$, $R^3$ and $R^4$ are hydrocarbyls, halohydrocarbyls, and perhalocarbyls, inclusive of heteroatoms, that include, —$(CH_2)_n$—Ar—$(CH_2)_n$—$C(CF_3)_2$—OH, —$(CH_2)_n$—Ar—$(CH_2)_n$—$OCH_2C(CF_3)_2$—OH, —$(CH_2)_n$—$C(CF_3)_2$—OH, —$((CH_2)_i$—O—$)_k$—$(CH_2)$—$C(CF_3)_2$—OH, —$(CH_2)_n$—$C(CF_3)(CH_3)$—OH, —$(CH_2)_n$—C(O)NHR*, —$(CH_2)_n$—C(O)Cl, —$(CH_2)_n$—C(O)OR*, —$(CH_2)_n$—OR*, —$(CH_2)_n$—OC(O)R* and —$(CH_2)_n$—C(O)R*, where n independently represents an integer from 0 to 12, i is 2, 3 or 4, k is 1, 2 or 3, Ar is aryl, for example phenyl, and R* independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl. Exemplary perhalogenated alkyl groups include, but are not limited to, trifluoromethyl, trichloromethyl, —$C_2F_5$, —$C_3F_7$, —$C_4F_9$, —$C_7F_{15}$, and —$C_{11}F_{23}$. Exemplary halogenated or perhalogenated aryl and aralkyl groups include, but are not limited groups having the formula —$(CH_2)_x$-$C_6F_yH_{5-y}$, and —$(CH_2)_x$—$C_6F_yH_{4-y}$-$pC_zF_qH_{2z+1-q}$, where x, y, q, and z are independently selected integers from 0 to 5, 0 to 5, 0 to 9, and 1 to 4, respectively. Specifically, such exemplary halogenated and perhalogenated aryl groups include, but are not limited to, pentachlorophenyl, pentafluorophenyl, pentafluorobenzyl, 4-trifluoromethylbenzyl, pentafluorophenylethyl, pentafluorophenpropyl, and pentafluorophenbutyl.

While each Formula I and Ia, as well as each of the subformulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that embodiments of the present invention are made to take advantage of such differences by using monomers that are either a mixture of isomers that is rich in either the exo- or endo-isomer, or are essentially the pure advantageous isomer.

Another embodiment of the present invention is directed to polymers of Formula I that comprise repeating units where one of $R^{1-4}$, for example $R^1$, is a fluorinated or perfluorinated alkyl, aryl or aralkyl group as described above and the others of $R^{1-4}$ are H. Another embodiment of this invention, $R^1$ is selected from one of the above subformulae 15-26 and in one embodiment from subformulae 15, 16, 17, 18, 19 or 20 ($NBC_4F_9$, $NBCH_2C_6F_5$, $NBC_6F_5$, $NBCH_2C_6H_3F_2$, $NBCH_2C_6H_4CF_3$, and $NBalkylC_6F_5$).

Another embodiment of the present invention is directed to polymers of Formula I that have repeating units where one of $R^{1-4}$, for example $R^1$, is a photoreactive or crosslinkable group as described above and the others of $R^{1-4}$ are H. $R^1$ is a group as shown in one of the above subformulae 27-50 and as shown in subformulae 34, 35, 36, 37 and 38 (DMMI-MeNB, DMMIEtNB, DMMIPrNB, DMMIBuNB and DMMIHxNB).

Another embodiment of the present invention is directed to polymers of Formula I that have repeating units where one of $R^{1-4}$, for example $R^1$, is a pendant silyl group represented by $-(CH_2)_n-SiR^{93}$ where n is an integer from 0 to 12, $R^9$ independently represents halogen selected from the group consisting of chlorine, fluorine, bromine and iodine, linear or branched ($C_1$ to $C_{20}$)alkyl, linear or branched ($C_1$ to $C_{20}$)alkoxy, substituted or unsubstituted ($C_6$ to $C_{20}$)aryl, linear or branched ($C_1$ to $C_{20}$)alkyl carbonyloxy, substituted or unsubstituted ($C_6$ to $C_{20}$)aryloxy; linear or branched ($C_1$ to $C_{20}$) dialkylamido; substituted or unsubstituted ($C_6$-$C_{20}$) diarylamido; substituted or unsubstituted ($C_1$-$C_{20}$)alkylarylamido.

Another embodiment of the present invention is directed to polymers of Formula I that have repeating units where one of $R^{1-4}$, for example $R^1$, is a polar group having a hydroxy, carboxy, acetoxy or oligoethyleneoxy moiety as described above and the others of $R^{1-4}$ denote H. Preferably $R^1$ is a group as shown in one of the above subformulae 9-14, and generally of subformula 9 (MeOAcNB).

Another embodiment of the present invention is directed to a polymer having a first type of repeating unit selected from fluorinated repeating units as described above and a second type of repeating unit selected from crosslinkable repeating units, also as described above. Polymers of this embodiment include polymers having a first type of repeating unit selected from subformulae 15, 16, 17, 18, 19 and 20 ($NBC_4F_9$, $NBCH_2C_6F_5$, $NBC_6F_5$, $NBCH_2C_6F_2$, $NBCH_2C_6H_4CF_3$, $NBalkylC_6F_5$), and a second type of repeating unit selected from subformulae 34, 35, 36, 37 and 38 (DMMIMeNB, DMMIEtNB, DMMIPrNB, DMMIBuNB, DMMIHxNB).

Another embodiment of the present invention is directed to a polymer having a first type of repeating unit selected from crosslinkable repeating units as described above and a second type of repeating unit selected from repeating units having a pendant silyl group, also as described above. Polymers of this embodiment include polymers having a first type of repeating unit selected from subformulae 34, 35, 36, 37 and 38 (DMMIMeNB, DMMIEtNB, DMMIPrNB, DMMIBuNB, DMMIHxNB), and a second type of repeating unit selected from subformulae 53 and 54 (TMSNB, TESNB).

Another embodiment of the present invention is directed to a polymer having a first type of repeating unit selected from fluorinated repeating units as described above, a second type of repeating unit selected from crosslinkable repeating units, also as described above and a third type of repeating unit selected from polar repeating units, again as described above. Polymers of this embodiment include polymers having a first repeating unit of subformula 9 (MeOAcNB), a second type of repeating unit selected from subformulae 34, 35, 36, 37, or 38 (DMMIMeNB, DMMIEtNB, DMMIPrNB, DMMIBuNB, DMMIHxNB), and a third type of repeating unit selected from subformula 16 ($NBCH_2C_6F_5$).

Another embodiment of the present invention is directed to a polymer having more than three different types of repeating units in accordance with Formula I. Another embodiment of the present invention is directed to a polymer blend of a first polymer having a first type of repeating unit in accordance with Formula I, and a second polymer having, at least, a first type of repeating unit and a second type of repeating unit in accordance with Formula I that is distinct from the first type. Alternatively such polymer blends can encompass the aforementioned second polymer mixed with an alternative first polymer having two or more distinct types of repeat units in accordance with Formula I. Alternatively, such polymer blends can encompass the aforementioned alternative first polymer mixed with an alternative second polymer having three distinct types of repeat units in accordance with Formula I.

Another embodiment of the present invention is directed to a polymer having a first and a second distinct type of repeat units in accordance with Formula I where the ratio of such first and second type of repeat units is from 95:5 to 5:95. In another embodiment the ratio of such first and second type of repeat units is from 80:20 to 20:80. In still another embodiment the ratio of such first and second type of repeat units is from 60:40 to 40:60. In yet another embodiment the ratio of such first and second type of repeat units is from 55:45 to 45:55.

Another embodiment of the present invention encompasses a polymer blend of one or more polymers each having at least one type of repeat unit in accordance with Formula I and one or more polymers having repeat units that are different from norbornene-type repeat units. These other polymers are selected from polymers including but not limited to poly(methyl methacrylate) (PMMA), polystyrene (PS), poly-4-vinylphenol, polyvinylpyrrolidone, or combinations thereof, like PMMA-PS and -polyacrylonitrile (PAN).

Examples of suitable norbornene monomers, polymers and methods for their synthesis are provided herein and can also be found in U.S. Pat. No. 5,468,819 B2, U.S. Pat. No. 6,538,087 B2, US 2006/0020068 A1, US 2007/0066775 A1, US 2008/0194740 A1, PCT/EP2011/004281, U.S. Ser. No. 13/223,784, PCT/EP2011/004282, U.S. Pat. No. 6,723,486 B2, U.S. Pat. No. 6,455,650 B2 and U.S. Ser. No. 13/223,884, which are incorporated into this application by reference. For example, exemplary polymerizations processes employing Group VIII transition metal catalysts are described in the aforementioned US 2006/0020068 A1.

The polymer embodiments of the present invention are formed having a weight average molecular weight ($M_w$) that is appropriate to their use. Generally, a $M_w$ from 5,000 to 500,000 is found appropriate for some embodiments, while for other embodiments other $M_w$ ranges can be advantageous. For example, in a embodiment, the polymer has a $M_w$ of at least 30,000, while in another embodiment the polymer has a $M_w$ of at least 60,000. In another embodiment, the upper limit of the polymer's $M_w$ is up to 400,000, while in another embodiment the upper limit of the polymer's $M_w$ is up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention.

In an embodiment of the present invention, a crosslinkable or crosslinked polymer is used. It has been found that such a crosslinkable or crosslinked polymer can serve to improve one or more properties selected from structural integrity, durability, mechanical resistivity and solvent resistivity of the gate dielectric layer and the electronic device. Suitable crosslinkable polymers are for example those having one or more repeating units of Formula I wherein one or more of $R^{1-4}$ denotes a crosslinkable group, units formed by monomers selected from subformulae 27-50.

For crosslinking, the polymer, generally after deposition thereof, is exposed to electron beam or electromagnetic (actinic) radiation such as X-ray, UV or visible radiation, or heated if it contains thermally crosslinkable groups. For example, actinic radiation may be employed to image-wise expose the polymer using a wavelength of from 11 nm to 700 nm, such as from 200 to 700 nm. A dose of actinic radiation for exposure is generally from 25 to 15,000 mJ/cm$^2$. Suitable radiation sources include mercury, mercury/xenon, mercury/halogen and xenon lamps, argon or xenon laser sources, x-ray. Such exposure to actinic radiation causes crosslinking in exposed regions. Although other repeating unit pendant groups that crosslink can be provided, generally such crosslinking is provided by repeating units that encompass a maleimide pendant group, that is to say one of $R^1$ to $R^4$ is a substituted or unsubstituted maleimide moiety. If it is desired to use a light source having a wavelength outside of the photo-absorption band of the maleimide group, a radiation sensitive photosensitizer can be added. If the polymer contains thermally crosslinkable groups, optionally an initiator may be added to initiate the crosslinking reaction, for example in case the crosslinking reaction is not initiated thermally.

In one embodiment, the planarization layer is post exposure baked at a temperature from 70° C. to 130° C., for example for a period of from 1 to 10 minutes. Post exposure bake can be used to further promote crosslinking of crosslinkable moieties within exposed portions of the polymer.

In another embodiment, the crosslinkable polymer composition comprises a stabilizer material or moiety to prevent spontaneous crosslinking and improve shelf life of the polymer composition. Suitable stabilizers are antioxidants such as catechol or phenol derivatives that optionally contain one or more bulky alkyl groups, for example t-butyl groups, in ortho-position to the phenolic OH group.

In order to improve the processing of the functional layers and the integrity of the electronic device, it is desirable to decrease the time needed for the process while keeping or improving the physical properties of the layers being formed. This can be maintained where subsequent layers and solvents used in forming such layers are orthogonal and thus do not dissolve each other. Where such orthogonality is difficult to obtain, crosslinking, typically UV crosslinking, a first functional layer to make such first layer insoluble with respect to the polymer composition of a second functional layer will prevent any influence of the properties of either layer on the other layer.

Shortening the time needed for the processing can be done for example by tuning the coating process, while decreasing the time needed for UV crosslinking can be achieved both by chemical adjustment of the polymer or by changes in the process.

However, chemical modifications of polymers are limited, because the UV sensitivity is related to certain properties of the polymer, and for example changes towards increased UV sensitivity may decrease the solubility. Changing the process, for example, by using higher power UV, could increase the possibility of creating an ozone atmosphere and thus cause undesired changes in the surface of the polymer.

Therefore, in some embodiments in accordance with the present invention the polymer composition comprises one or more crosslinker additives. Such additives comprise two or more functional groups that are capable of reacting with the pendant crosslinkable groups of the polycycloolefinic polymer. It will also be understood that the use of such crosslinker additives can also enhance the crosslinking of the aforementioned polymer.

In some embodiments in accordance with the present invention, crosslinking can be achieved by exposure to UV radiation.

The crosslinkable group of the crosslinker is selected from a maleimide, a 3-monoalkyl-maleimide, a 3,4-dialkylmaleimide, an epoxy, a vinyl, an acetylene, an indenyl, a cinnamate or a coumarin group, or a group that comprises a substituted or unsubstituted maleimide portion, an epoxide portion, a vinyl portion, an acetylene portion, an indenyl portion, a cinnamate portion or a coumarin portion.

In some embodiments in accordance with the present invention, the crosslinker is selected of formula III1 or III2

$$P\text{-}A''\text{-}X'\text{-}A''\text{-}P \qquad \text{III1}$$

$$H_{4-c}C(A''\text{-}P)_c \qquad \text{III2}$$

wherein X' is O, S, NH or a single bond, A'' is a single bond or a connecting, spacer or bridging group, which is for example selected from $(CZ_2)_n$, $(CH_2)_n$—$(CH=CH)_p$—$(CH_2)_n$, $(CH_2)_n$—O—$(CH_2)_n$, $(CH_2)_n$—$C_6Q_{10}$-$(CH_2)_n$, and C(O), where each n is independently an integer from 0 to 12, p is an integer from 1-6, Z is independently H or F, $C_6Q_{10}$ is cyclohexyl that is substituted with Q, Q is independently H, F, $CH_3$, $CF_3$, or $OCH_3$, P is a crosslinkable group, and c is 2, 3, or 4, and where in formula III1 at least one of X' and the two groups A'' is not a single bond.

In one embodiment P is selected from a maleimide group, a 3-monoalkyl-maleimide group, a 3,4-dialkylmaleimide group, an epoxy group, a vinyl group, an acetylene group, an indenyl group, a cinnamate group or a coumarin group, or comprises a substituted or unsubstituted maleimide portion, an epoxide portion, a vinyl portion, an acetylene portion, an indenyl portion, a cinnamate portion or a coumarin portion.

Suitable compounds of formula III1 are selected from formula C1:

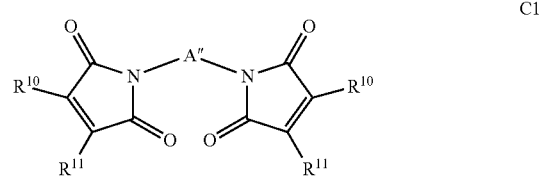

C1 wherein $R^{10}$ and $R^{11}$ are independently of each other H or a $C_1$-$C_6$ alkyl group, and A'' is as defined in formula III1. In one embodiment of this invention, the crosslinkers are selected from DMMI-butyl-DMMI, DMMI-pentyl-DMMI and DMMI-hexyl-DMMI, wherein "DMMI" means 3,4-dimethylmaleimide.

In one embodiment the spacer group A'' denotes linear $C_1$ to $C_{30}$ alkylene or branched $C_3$ to $C_{30}$ alkylene or cyclic $C_5$ to $C_{30}$ alkylene, each of which is unsubstituted or mono- or polysubstituted by F, Cl, Br, I, or CN, wherein optionally one or more non-adjacent $CH_2$ groups are replaced, in each case independently from one another, by —O—, —S—, —NH—, —NR$^{18}$—, —SiR$^{18}$R$^{19}$—, —C(O)—, —C(O) O—, —OC(O)—, —OC(O)—O—, —S—C(O)—, —C(O)—S—, —CH═CH— or —C≡C— in such a manner that O and/or S atoms are not linked directly to one another, R$^{18}$ and R$^{19}$ are independently of each other H, methyl, ethyl or a C$_3$ to C$_{12}$ linear or branched alkyl group.

Suitable groups A" are —(CH$_2$)$_r$—, —(CH$_2$CH$_2$O)$_s$—, —CH$_2$CH$_2$—, —CH$_2$CH$_2$—S—CH$_2$CH$_2$— or —CH$_2$CH$_2$—NH—CH$_2$CH$_2$— or —(SiR$^{18}$R$^{19}$—O)$_r$—, with r being an integer from 2 to 12, s being 1, 2 or 3 and R$^{18}$ and R$^{19}$ having the meanings given above.

Further groups A" are selected from methylene, ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene, and butenylene.

The synthesis of crosslinkers like those of formula C1 is disclosed for example in U.S. Pat. No. 3,622,321 which is incorporated by reference into this application.

The polymer compositions generally encompass, in addition to one or more polymer components, a casting solvent optionally having orthogonal solubility properties with respect to the insulating layer material and the OSC layer, an optional crosslinking agent, an optional reactive solvent, an optional UV sensitizer, and an optional thermal sensitizer.

In another embodiment the polymer composition used for preparation of the planarization layer comprises a crosslinkable polycycloolefinic polymer and a reactive adhesion promoter. The reactive adhesion promoter comprises a first functional group that is capable of crosslinking with the pendant crosslinkable group in the crosslinkable polycycloolefinic polymer, and a second functional group which is a surface-active group that is capable of interactions, for example chemical bonding, with the functional layer provided onto the planarization layer. The adhesion promoter may be used especially if the the functional layer provided onto the planarization layer is a semiconducting or dielectric layer.

Suitable adhesion promoters are selected of formula IV

G-A"-P IV wherein G is a surface-active group, preferably a silane or silazane group, A" is a single bond or a connecting, spacer or bridging group, preferably as defined in formula III1 above, and P is a crosslinkable group, preferably as defined in formula III1 above.

In one embodiment G is a group of the formula —SiR$^{12}$R$^{13}$R$^{14}$, or a group of the formula —NH—SiR$^{12}$R$^{13}$R$^{14}$, wherein R$^{12}$, R$^{13}$ and R$^{14}$ are each independently selected from halogen, silazane, C$_1$-C$_{12}$-alkoxy, C$_1$-C$_{12}$-alkylamino, optionally substituted C$_5$-C$_{20}$-aryloxy and optionally substituted C$_2$-C$_{20}$-heteroaryloxy, and wherein one or two of R$^{12}$, R$^{13}$ and R$^{14}$ may also denote C$_1$-C$_{12}$-alkyl, optionally substituted C$_5$-C$_{20}$-aryl or optionally substituted C$_2$-C$_{20}$-heteroaryl.

In another embodiment P is selected from a maleimide, a 3-monoalkyl-maleimide, a 3,4-dialkylmaleimide, an epoxy, a vinyl, an acetyl, an indenyl, a cinnamate or a coumarin group, or comprises a substituted or unsubstituted maleimide portion, an epoxide portion, a vinyl portion, an acetyl portion, an indenyl portion, a cinnamate portion or a coumarin portion.

In another embodiment A" is selected from (CZ$_2$)$_n$, (CH$_2$)$_n$—(CH═CH)$_p$—(CH$_2$)$_n$, (CH$_2$)$_n$—O, (CH$_2$)$_n$—O—(CH$_2$)$_n$, (CH$_2$)$_n$—C$_6$Q$_4$-(CH$_2$)$_n$, (CH$_2$)$_n$—C$_6$Q$_{10}$-(CH$_2$)$_n$ and C(O)—O, where each n is independently an integer from 0 to 12, p is an integer from 1-6, Z is independently H or F, C$_6$Q$_4$ is phenyl that is substituted with Q, C$_6$Q$_{10}$ is cyclohexyl that is substituted with Q, Q is independently H, F, CH$_3$, CF$_3$ or OCH$_3$.

Suitable adhesion promoters are selected from formula A1:

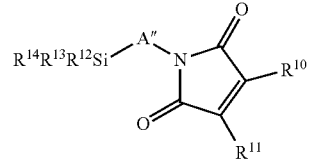

A1 where R$^{12}$, R$^{13}$ R$^{14}$, and A" are as defined above, and R$^{10}$ and R$^{11}$ are each independently H or a C$_1$-C$_6$ alkyl group. Suitable compounds of formula A1 are for example DMMI-propyl-Si(OEt)$_3$, DMMI-butyl-Si(OEt)$_3$, DMMI-butyl-Si(OMe)$_3$, DMMI-hexyl-Si(OMe)$_3$, wherein "DMMI" means 3,4-dimethylmaleimide.

The present invention also relates to an electronic device having or being obtained through the use of a polymer composition according to the present invention. Such electronic devices include, among others, field effect transistors (FETs) and organic field effect transistors (OFETs), thin film transistors (TFT) and organic thin film transistors (OTFTs), which can be top gate or bottom gate transistors. For example, transistors made through the use of a polymer composition according to the present invention are depicted schematically in FIGS. 3 and 4.

Figure 2:
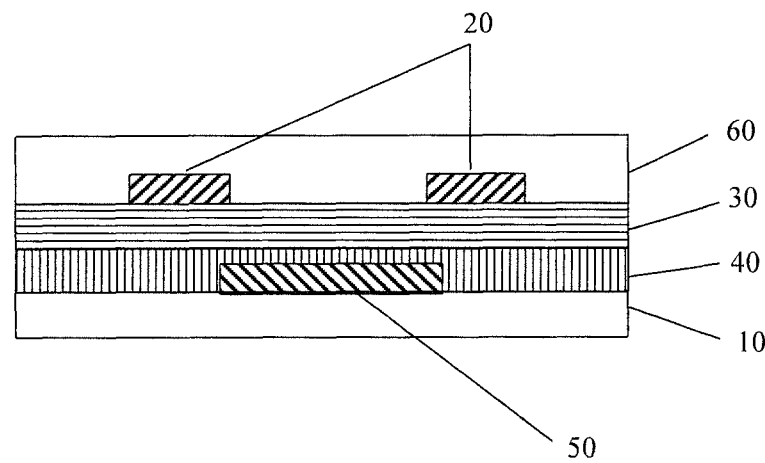
FIG. 2 is a schematic representation of a bottom gate OFET device according to prior art.

FIG. 1 and FIG. 2 depict schematic representations of top and bottom gate organic field effect transistors, respectively, according to prior art. Thus the OFET device of FIG. 1 and FIG. 2 include substrate 10, source and drain electrodes 20, organic semiconductor layer 30, gate dielectric layer 40, gate electrode 50, and an optional passivation layer 60.

Figure 3:
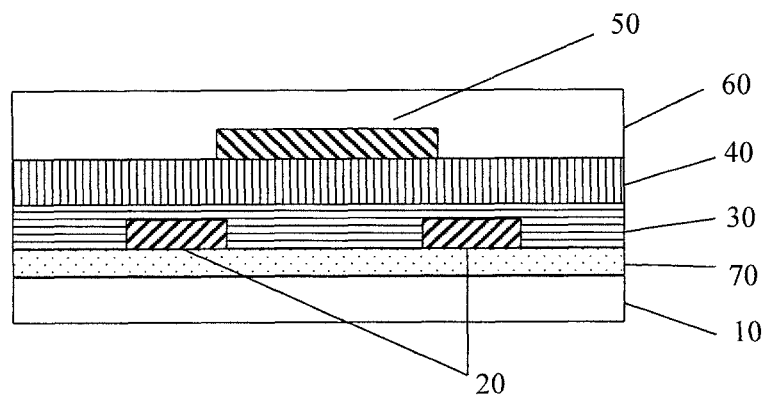
FIG. 3 is a schematic representation of a top gate OFET device in accordance with an embodiment of the present invention.

FIG. 3 is a schematic and exemplary representation of a top gate OFET device in accordance with one embodiment of the present invention. Such OFET device includes substrate 10, planarization layer 70, which is derived from a polymer composition encompassing a polycycloolefinic polymer or blend of polycycloolefinic polymer as described above and below, source and drain electrodes 20, organic semiconductor layer 30, gate electrode 50, gate dielectric layer 40, and optional layer 60, which is for example a layer having one or more of insulating, protecting, stabilizing and adhesive function, and which is disposed overlying gate electrode 50 and gate dielectric layer 40.

Another subject of the present invention is a process for preparing a top gate OFET device, for example as illustrated in FIG. 3, by a) depositing a layer of planarization material 70, which comprises a polycycloolefinic polymer or a polymer blend or polymer composition comprising a polycycloolefinic polymer as described above and below, on a substrate 10, b) forming source and drain electrodes 20 on at least a portion of planarization layer 70 as depicted, c) depositing a layer of organic semiconductor material 30 over the previously deposited planarization layer 70 and source and drain electrodes 20, d) depositing a layer of dielectric material 40 on organic semiconductor layer 30, e) forming gate electrode 50 on at least a portion of dielectric layer 40 as depicted, and f) optionally depositing layer 60, which is for example an insulating and/or protection and/or stabilizing and/or adhesive layer, on the gate electrode 50 and portions of dielectric layer 40.

Figure 4:
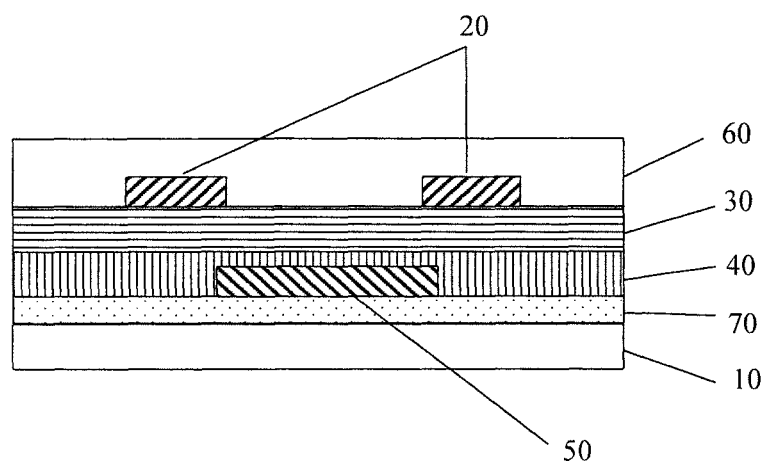
FIG. 4 is a schematic representation of a bottom gate OFET device in accordance with an embodiment of the present invention.

FIG. 4 is a schematic and exemplary representation of a bottom gate OFET device in accordance with an embodiment of the present invention. Such OFET device includes substrate 10, planarization layer 70, which is derived from a polymer composition encompassing a polycycloolefinic polymer or blend of polycycloolefinic polymer as described above and below, source and drain electrodes 20, organic semiconductor layer 30, gate electrode 50, gate dielectric layer 40, and optional second insulator layer 60, which is a passivation or protection layer to shield the source and drain electrodes 20 from further layers or devices provided on top of the device.

Another subject of the present invention is a process for preparing a bottom gate OFET device, for example as illustrated in FIG. 4, by a) depositing a layer of planarization material 70, which comprises a polycycloolefinic polymer or a polymer blend or polymer composition comprising a polycycloolefinic polymer as described above and below, on a substrate 10, b) forming gate electrode 50 on at least a portion of planarization layer 70 as depicted, c) depositing a layer of dielectric material 40 over the previously deposited planarization layer 70 and gate electrode 50, d) depositing a layer of organic semiconductor material 30 on dielectric layer 40, e) forming source and drain electrodes 20 on at least a portion of organic semiconductor layer 40 as depicted, and f) optionally depositing layer 60, which is for example an insulating and/or protection and/or stabilizing and/or adhesive layer, on the source and drain electrodes 20 and portions of organic semiconductor layer 30.

The aforementioned processes for preparing a transistor are another subject of the present invention.

Deposition and/or forming of the layers and structures of the OFET embodiments in accordance with the present invention are performed using solution processing techniques where such techniques are possible. For example a formulation or composition of a material, typically a solution encompassing one or more organic solvents, can be deposited or formed using techniques that include, but are not limited to, dip coating, spin coating, slot die coating, ink jet printing, letter-press printing, screen printing, doctor blade coating, roller printing, reverse-roller printing, offset lithography printing, flexographic printing, web printing, spray coating, brush coating, or pad printing, followed by the evaporation of the solvent employed to form such a solution. For example, an organic semiconductor material and an organic dielectric material can each be deposited or formed by spin coating, flexographic printing, and inkjet printing techniques in an order appropriate to the device being formed. In one embodiment of this invention slot die coating can be employed.

Specifically, where planarization layer 70 is deposited by solution processing and employing a solution of one or more of the polymer or polymer blends as described above and below in one or more organic solvents, such solvents are preferably selected from, but not limited to, organic ketones such as methyl ethyl ketone (MEK), 2-heptanone (MAK), cyclohexanone, cyclopentanone, and ethers such as butylphenyl ether, 4-methylanisole and aromatic hydrocarbons such as cyclohexylbenzene, or mixtures thereof. In one embodiment, the total concentration of the polymer material in the formulation is from 0.1-25 wt. % although other concentrations can also be appropriate. Organic ketone solvents with a high boiling point have been found to be especially suitable and preferred solvents where inkjet and flexographic printing techniques are employed.

The planarization layer 70 should be applied with an appropriate thickness to provide sufficient wetting and adhesion for any additional layers coated thereon while not negatively affecting device performance. While the appropriate thickness of planarization layer 70 used in fabricating a device is a function of the specific device being made and the ultimate use of such a device, among other things, as general guidelines it has been found that a preferred thickness in the range of from 0.1 to 10 microns. It will be understood, however, that other thickness ranges may be appropriate and thus are within the scope of the present invention.

In other embodiments of the present invention, a crosslinkable or crosslinked polymer is used as the planarization layer material or as a component thereof. It has been found that such a crosslinkable or crosslinked polymer can serve to improve one or more properties selected from structural integrity, durability and solvent resistance of the planarization layer and the electronic device. Very suitable and preferred crosslinkable polymers are for example those having one or more repeating units of Formula I wherein one or more of $R^{1-4}$ denotes a crosslinkable group, very preferably units of subformulae 27-50.

For crosslinking, the polymer, generally after deposition thereof, is exposed to electron beam or electromagnetic (actinic) radiation such as X-ray, UV or visible radiation, or heated if it contains thermally crosslinkable groups. For example, actinic radiation may be employed to image the polymer using a wavelength of from 11 nm to 700 nm, such as from 200 to 700 nm. A dose of actinic radiation for exposure is generally from 25 to 15,000 mJ/cm$^2$. Suitable radiation sources include mercury, mercury/xenon, mercury/halogen and xenon lamps, argon or xenon laser sources, or X-ray. Such exposure to actinic radiation is to cause crosslinking in exposed regions. Although other repeating unit pendant groups that crosslink can be provided, generally such crosslinking is provided by repeating units that encompass a maleimide pendant group, that is to say one of $R^1$ to $R^4$ is a substituted or unsubstituted maleimide moiety. If it is desired to use a light source having a wavelength outside of the photo-absorption band of the maleimide group, a radiation sensitive photosensitizer can be added. If the polymer contains thermally crosslinkable groups, optionally an initiator may be added to initiate the crosslinking reaction, for example in case the crosslinking reaction is not initiated thermally.

In an embodiment, the planarization layer is post exposure baked at a temperature from 70° C. to 130° C., for example for a period of from 1 to 10 minutes. Post exposure bake can be used to further promote crosslinking of crosslinkable moieties within exposed portions of the polymer.

The other components or functional layers of the electronic device, like the substrate, the gate and source and drain electrodes, and organic semiconductor layer, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

Generally the thickness of a functional layer, for example a gate dielectric or organic semiconductor layer, in some electronic device embodiments according to the present invention is from 0.001 (in case of a monolayer) to 10 μm; In other embodiments such thickness ranges from 0.001 nm to 1 μm, and in still other embodiments from 5 nm to 500 nm, although other thicknesses or ranges of thickness are contemplated and thus are within the scope of the present invention.

Various substrates may be used for the fabrication of the electronic device embodiments of the present invention. For example glass or polymeric materials are most often used. In other embodiments, polymeric materials include, but are not limited to, alkyd resins, allyl esters, benzocyclobutenes, butadiene-styrene, cellulose, cellulose acetate, epoxy polymers, ethylene-chlorotrifluoro ethylene copolymers, ethylene-tetra-fluoroethylene copolymers, fiber glass enhanced thermoplastic, fluorocarbon polymers, hexafluoropropylenevinylidene-fluoride copolymer, polyethylene, parylene, polyamide, polyimide, polyaramid, polydimethylsiloxane, polyethersulphone, polyethylenenaphthalate, polyethyleneterephthalate, polyketone, polymethylmethacrylate, polypropylene, polystyrene, polysulphone, polytetrafluoroethylene, polyurethanes, polyvinylchloride, polycycloolefin, silicone rubbers, and silicones, where polyethyleneterephthalate, polyimide, polycycloolefin and polyethylenenaphthalate materials have been found most appropriate. Additionally, for some embodiments of the present invention the substrate can be any thermoplastic, metal or glass material coated with one or more of the above listed materials.

In one embodiment, the substrate is a polymer film of a polymer selected from the group consisting of polyesters, polyimides, polyarylates, polycycloolefins, polycarbonates and polyethersulphones.

In other embodiments, polyester substrates, most preferably polyethylene terephthalate (PET) or polyethylene naphthalate (PEN), for example PET films of the Melinex® series or PEN films of the Teonex® series, both from DuPont Teijin Films™ may be used.

The gate, source and drain electrodes of the OFET device embodiments in accordance with the present invention can be deposited or formed by liquid coating, such as spray-, dip-, web- or spin-coating, or by vacuum deposition methods, including but not limited to physical vapor deposition (PVD), chemical vapor deposition (CVD) or thermal evaporation. Suitable electrode materials and deposition methods are known to the person skilled in the art. Suitable electrode materials include, without limitation, inorganic or organic materials, or composites of the two. Exemplary electrode materials include polyaniline, polypyrrole, poly(3,4-ethylene-dioxythiophene) (PEDOT) or doped conjugated polymers, further dispersions or pastes of graphite or graphene or particles of metal such as Au, Ag, Cu, Al, Ni or their mixtures as well as sputter coated or evaporated metals such as Cu, Cr, Pt/Pd, Ag, Au or metal oxides such as indium tin oxide (ITO), F-doped ITO or Al-doped ZnO. Organometallic precursors may also be used and deposited from a liquid phase.

The organic semiconductor materials and methods for applying the organic semiconductor layer for OFET embodiments in accordance with the present invention can be selected from standard materials and methods known to the person skilled in the art, and are described in the literature. The organic semiconductor can be an n- or p-type OSC, which can be deposited by PVD, CVD or solution deposition methods. Effective OSCs exhibit a FET mobility of greater than $1\times10^{-5}$ $cm^2V^{-1}s^{-1}$.

OSC embodiments in accordance with the present invention can be either OFETs where the OSC is used as the active channel material, OPV devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating, or printing methods such as ink-jet printing, flexo printing or gravure printing, are typically employed to allow for ambient temperature processing. However, OSCs can be deposited by any liquid coating technique, for example ink-jet deposition or via PVD or CVD techniques.

For some OFET embodiments, the semiconducting layer that is formed can be a composite of two or more of the same or different types of organic semiconductors. For example, a p-type OSC material may, for example, be mixed with an n-type material to achieve a doping effect of the layer. In some embodiments of the invention, multilayer organic semiconductor layers are used. For example an intrinsic organic semiconductor layer can be deposited near the gate dielectric interface and a highly doped region can additionally be coated adjacent to such an intrinsic layer.

The OSC material employed for electronic device embodiments in accordance with the present invention can be any conjugated molecule, for example an aromatic molecule containing preferably two or more, very preferably at least three aromatic rings. In some embodiments of the present invention, the OSC contains aromatic rings selected from 5-, 6- or 7-membered aromatic rings, while in other embodiments the OSC contains aromatic rings selected from 5- or 6-membered aromatic rings. The OSC material may be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings may be optionally substituted with alkyl, alkoxy, polyalkoxy, thioalkyl, acyl, aryl or substituted aryl groups, halogen, where fluorine, cyano, nitro or an optionally substituted secondary or tertiary alkylamine or arylamine represented by $-N(R^{15})(R^{16})$, where $R^{15}$ and $R^{16}$ are each independently H, an optionally substituted alkyl or an optionally substituted aryl, alkoxy or polyalkoxy groups are typically employed. Further, where $R^{15}$ and $R^{16}$ is alkyl or aryl these may be optionally fluorinated.

The aforementioned aromatic rings can be fused rings or linked with a conjugated linking group such as $-C(T_1)=C(T_2)-$, $-C\equiv C-$, $-N(R''')-$, $-N=N-$, $(R''')=N-$, $-N=C(R''')-$, where $T_1$ and $T_2$ each independently represent H, Cl, F, $-C\equiv N$ or lower alkyl groups such as $C_{1-4}$ alkyl groups; R''' represents H, optionally substituted alkyl or optionally substituted aryl. Further, where R''' is alkyl or aryl can be fluorinated.

In some preferred electronic device embodiments of the present invention, OSC materials that can be used include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons, such as, tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

Further, in some embodiments in accordance with the present invention, the OSC materials are polymers or copolymers that encompass one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Further p-type OSCs are copolymers comprising electron acceptor and electron donor units. Copolymers of this embodiment are for example copolymers comprising one or more benzo[1,2-b:4,5-b']dithiophene-2,5-diyl units that are 4,8-disubstituted by one or more groups R as defined above, and further comprising one or more aryl or heteroaryl units selected from Group A and Group B, comprising at least one unit of Group A and at least one unit of Group B, wherein Group A consists of aryl or heteroaryl groups having electron donor properties and Group B consists of aryl or heteroaryl groups having electron acceptor properties, and Group A consists of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1",2":4,5;4",5":4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1",2":4,5;4",5":4',5']bis(silolo[3,2-b:3',2'-b']thiophene)-2,7-diyl, and 2,7-di-thien-2-yl-phenanthro[1,10,9,8-c,d,e,f,g]carbazole, all of which are optionally substituted by one or more, one or two groups R as defined above, and Group B consists of benzo[2,1,3]thiadiazole-4,7-diyl, 5,6-dialkyl-benzo[2,1,3]thiadiazole-4,7-diyl, 5,6-dialkoxybenzo[2,1,3]thiadiazole-4,7-diyl, benzo[2,1,3]selenadiazole-4,7-diyl, 5,6-dialkoxy-benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 5,6-dialkoxybenzo[2,1,3]oxadiazole-4,7-diyl, 2H-benzotriazole-4,7-diyl, 2,3-dicyano-1,4-phenylene, 2,5-dicyano,1,4-phenylene, 2,3-difluro-1,4-phenylene, 2,5-difluoro-1,4-phenylene, 2,3,5,6-tetrafluoro-1,4-phenylene, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, 3,6-pyrrolo[3,4-c]pyrrole-1,4-dione, all of which are optionally substituted by one or more, preferably one or two groups R as defined above.

In other embodiments of the present invention, the OSC materials are substituted oligoacenes such as pentacene, tetracene or anthracene, or heterocyclic derivatives thereof. Bis(trialkylsilylethynyl) oligoacenes or bis(trialkylsilylethynyl) heteroacenes, as disclosed for example in U.S. Pat. No. 6,690,029 or WO 2005/055248 A1 or U.S. Pat. No. 7,385,221, are incorporated by reference into this application, are also useful.

Where appropriate and needed to adjust the rheological properties as described for example in WO 2005/055248 A1, some embodiments of the present invention employ OSC compositions that include one or more organic binders.

The binder, which is typically a polymer, may comprise either an insulating binder or a semiconducting binder, or mixtures thereof may be referred to herein as the organic binder, the polymeric binder, or simply the binder.

Preferred binders according to the present invention are materials of low permittivity, that is, those having a permittivity ∈ of 3.3 or less. The organic binder preferably has a permittivity ∈ of 3.0 or less, more preferably 2.9 or less. Preferably the organic binder has a permittivity ∈ at of 1.7 or more. It is especially preferred that the permittivity of the binder is in the range from 2.0 to 2.9. Whilst not wishing to be bound by any particular theory it is believed that the use of binders with a permittivity ∈ of greater than 3.3, may lead to a reduction in the OSC layer mobility in an electronic device, for example an OFET. In addition, high permittivity binders could also result in increased current hysteresis of the device, which is undesirable.

Examples of a suitable organic binders include polystyrene, or polymers or copolymers of styrene and α-methyl styrene, or copolymers including styrene, α-methylstyrene and butadiene may suitably be used. Further examples of suitable binders are disclosed for example in US 2007/0102696 A1 is incorporated by reference into this application.

In one type of embodiment, the organic binder is one in which at least 95%, in an other embodiment at least 98% and another embodiment when all of the atoms consist of hydrogen, fluorine and carbon atoms.

The binder is preferably capable of forming a film, more preferably a flexible film.

The binder can also be selected from crosslinkable binders, such as. acrylates, epoxies, vinylethers, and thiolenes, preferably having a sufficiently low permittivity, very preferably of 3.3 or less. The binder can also be mesogenic or liquid crystalline.

In another embodiment the binder is a semiconducting binder, which contains conjugated bonds, especially conjugated double bonds and/or aromatic rings. Suitable and preferred binders are for example polytriarylamines as disclosed for example in U.S. Pat. No. 6,630,566.

The proportions of binder to OSC is typically 20:1 to 1:20 by weight, preferably 10:1 to 1:10 more preferably 5:1 to 1:5, still more preferably 3:1 to 1:3 further preferably 2:1 to 1:2 and especially 1:1. Dilution of the compound of formula I in the binder has been found to have little or no detrimental effect on the charge mobility, in contrast to what would have been expected from the prior art.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

Above and below, unless stated otherwise percentages are percent by weight and temperatures are given in degrees Celsius (° C.). The values of the dielectric constant ∈ ("permittivity") refer to values taken at 1,000 Hz and 20° C.

Unless stated otherwise, the values of the surface energy refer to those calculated from contact angle measurement of the polymers according to the method described in D. K. Owens, R. C. Wendt, "Estimation of the surface free energy of polymers", Journal of Applied Polymer Science, Vol. 13, 1741-1747, 1969 or "Surface and Interfacial Tension: Measurement, Theory, and Applications (Surfactant Science Series Volume 119)" by Stanley Hartland (Editor), Taylor & Francis Ltd; 2004 (ISBN: 0-8247-5034-9), chapter 7, p.: 375: "Contact Angle and Surface Tension Measurement" by Kenji Katoh).

COMPARISON EXAMPLE 1

Top Gate OFET with Teonex® PEN Film as Substrate

Teonex Q65FA® PEN film (available from DuPont Teijin Films™) was washed in methanol and treated with argon plasma for 3 min (microwave plasma generator, power: 100 W, argon flow: 500 ml/min) in order to increase surface energy of the substrate.

60 nm thick gold source drain electrodes were evaporated directly onto the PEN substrate with a parallel plate geometry of 20 µm wide by 1 mm long.

The electrodes were treated with Lisicon M001® (available from Merck Chemicals Ltd.) by spin coating from isopropyl alcohol and evaporating the excess off on a hot plate at 70° C. for 2 min.

An OSC Lisicon S1200-Series® formulation was used (available from Merck Chemicals Ltd.).

The OSC formulation was then printed as a 5×5 cm wide area block on the array of source/drain electrodes on the film as described above using a RK Flexiproof 100 flexographic printing with a 8 cm$^3$/m$^2$ loaded anilox and a Cyrel HiQS flexo mat running at 70 m/min speed. The printed OSC layer was then annealed at 70° C. for 5 min.

A dielectric layer of fluoro-polymer Lisicon D139® (9% solids available from Merck Chemicals Ltd.) was spun on top of the OSC layer on the device and annealed at 70° C. for 8 min to give a dry dielectric film of approximately 1 µm thick.

Finally a 40 nm thick gold gate electrode array of evaporated on top of the dielectric layer in such a way that it covered the existing source drain electrode structures.

The initial transfer curve was recorder at bias voltage of −5 V. Then the device was electrically stressed for 15 h using source/gate voltage of −40 V and the second transfer curve was recorded directly after the stress.

Figure 5:
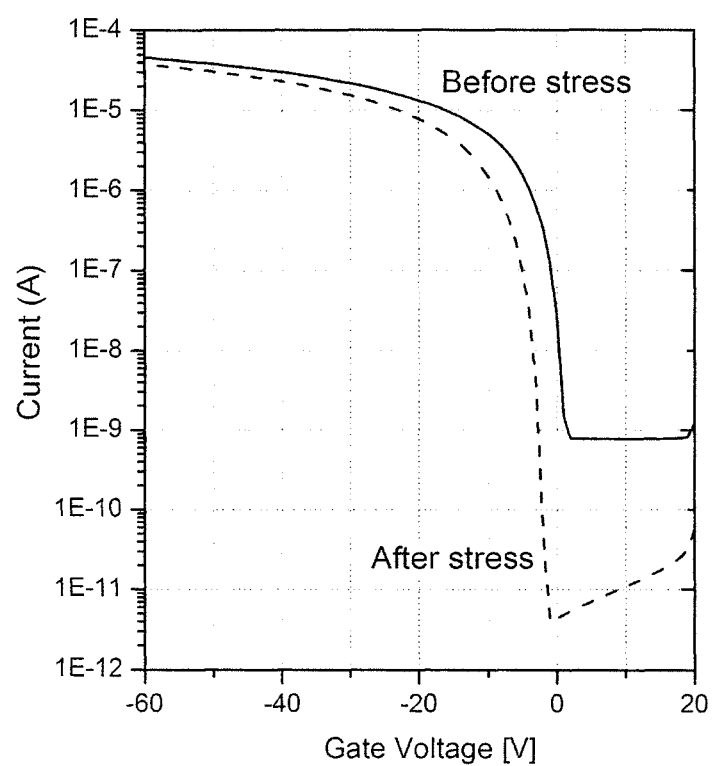
FIG. 5 is a transfer curve of the top gate OFET device of Comparison Example 1.

The transfer characteristics are shown in FIG. 5.

EXAMPLE 1

Top Gate OFET with a Teonex® Film Covered by a Polynorbornene Planarization Layer According to the Invention as Substrate Teonex Q65FA® film (available from DuPont Teijin Films™) was washed in methanol. A layer of the polymer poly(DMMIBuNB) (hereinafter abbreviated as "pDMMIBuNB"), which is a homopolymer of the monomer of formula (37), having a molecular weight $M_w$=100,000, was formed by depositing a solution of the polymer (17.5% TS in MAK with added 0.5% 1-chloro-4-propoxy-9H-thioxanthen-9-one w/w) onto the Teonex film via spin coating (1500 rpm, 30 s) followed by 8 min baking at 70° C. and 4 min UV exposure (UVA 0.011 W/cm$^2$, peak at 365 nm).

Approximately 60 nm thick gold source drain electrodes were evaporated onto the polynorbornene layer with a parallel plate geometry of 20 µm wide by 1 mm long.

The electrodes were treated with M001 (available from Merck Chemicals Ltd.) by spin coating from isopropyl alcohol and evaporating the excess off on a hot plate at 70° C. for 2 min.

The same OSC Lisicon S1200-Series® formulation as used in Comparison Example 1 was then printed as a 5×5 cm wide area block on the array of source/drain electrodes on the film as described above using a RK Flexiproof 100 flexographic printing with a 8 cm$^3$/m$^2$ loaded anilox and a Cyrel HiQS flexo mat running at 70 m/min speed. The printed OSC layer was then annealed at 70° C. for 5 min.

A dielectric layer of fluoro-polymer Lisicon D139® (9% solids available from Merck Chemicals Ltd.) was spun on top of the OSC layer on the device and annealed at 70° C. for 8 min to give a dry dielectric film approximately 1 µm thick.

Finally a 40 nm thick gold gate electrode array is evaporated on top of the dielectric layer in such a way that it covered the existing source drain electrode structures.

The initial transfer curve was recorder at bias voltage of −5 V. Then the device was electrically stressed for 15 h using source/gate voltage of −40 V and the second transfer curve was recorded directly after the stress.

Figure 6:
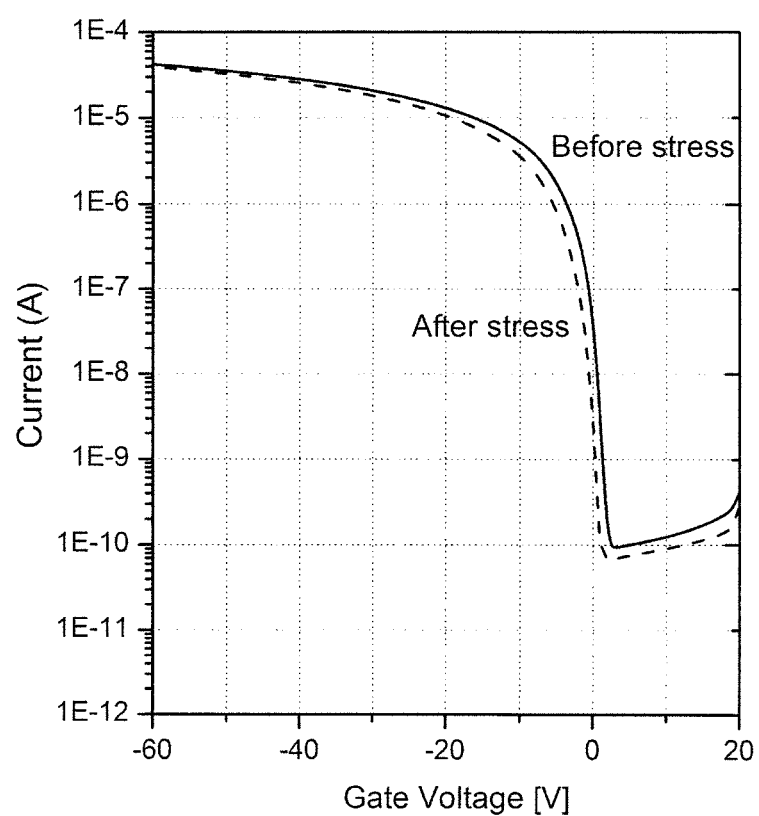
FIG. 6 is a transfer curve of the top gate OFET device of Example 1.

The transfer characteristics are shown in FIG. 6.

From FIG. 6 it can be seen that in the OFET device of Example 1, the layer of pDMMIBuNB on top of Teonex Q65FA® film improves stability of the electrical parameters, in comparison to the OFET device of Comparison Example 1 without the additional pDMMIBuNB layer (see FIG. 5). Stability of the source-drain current in the 'ON' state (under negative gate bias in case of using p-type semiconductors) and limited threshold voltage shift after application of negative gate bias stress (−40 V) are particularly important to ensure applicability of the transistors.

Such an improved long term stability of those parameters was observed for the devices containing the planarization layer of pDMMIBuNB, compared to devices without the layer of pDMMIBuNB.

The surface roughness of the substrates of Comparison Example 1 and Example 1 was measured by Atomic Force Microscopy (AFM).

As a result the surface roughness of the Teonex Q65FA® substrate as used in Comparison Example 1 is 0.6 nm (Ra) and 20 nm (Rt), whereas the the surface roughness of the same substrate coated with a layer of pDMMIBuNB as used in Example 1, is 0.2 nm (Ra) and 5 nm (Rt) for pDMMI-BuNB layer.

This shows that the surface roughness was significantly reduced after application of the planarization layer of pDMMIBuNB.

Surface energy measurements using the Owens-Wendt method were carried out for the substrates of Comparison Example 1 and Example 1.

As a result the surface energy of the Teonex Q65FA® substrate as used in Comparison Example 1 is 32 mN/m (without plasma treatment), whereas the the surface energy of the same substrate coated with a layer of pDMMIBuNB as used in Example 1, is 50 mN/m respectively.

Since de-wetting may occur at low surface energies <40 mN/m, the substrate of Comparison Example 1 needs further plasma treatment to increase surface energy. In contrast thereto, a surface modification of the pDMMIBuNB layer prior to the OSC deposition, for example in order to improve surface energy and wetting, is not required. Nevertheless, pDMMIBuNB is resistant to plasma treatment, which is commonly applied after a photolithographic process in order to remove post-process residues.

COMPARISON EXAMPLE 2

Top Gate OFET with Melinex® Film as Substrate

Melinex ST506® film (available from DuPont Teijin Films™) was washed in methanol and treated with argon plasma for 3 min (microwave plasma generator, power: 100 W, argon flow: 500 ml/min) in order to increase surface energy of the substrate.

Approximately 60 nm thick gold source drain electrodes were evaporated onto the directly onto the PEN substrate layer with a parallel plate geometry of 20 μm wide by 1 mm long.

The electrodes were treated with Lisicon M001® (available from Merck Chemicals Ltd.) by spin coating from isopropyl alcohol and evaporating the excess off on a hot plate at 70° C. for 2 min.

The same OSC Lisicon S1200-Series® formulation as used in Comparison Example 1 was then printed as a 5×5 cm wide area block on the array of source/drain electrodes on the film as described above using a RK Flexiproof 100 flexographic printing with a 8 cm$^3$/m$^2$ loaded anilox and a Cyrel HiQS flexo mat running at 70 m/min speed. The printed OSC layer was then annealed at 70° C. for 5 min.

A dielectric layer of fluoro-polymer Lisicon D139® (9% solids available from Merck Chemicals Ltd.) was spun on top of the OSC layer on the device and annealed at 70° C. for 8 min to give a dry dielectric film of approximately 1 μm thick.

Finally a 40 nm thick gold gate electrode array is evaporated on top of the dielectric layer in such a way that it covered the existing source drain electrode structures.

The initial transfer curve was recorder at bias voltage of −5 V. Then the device was electrically stressed for 2 h using source/gate voltage of 30 V and the second transfer curve was recorded directly after the stress.

Figure 7:
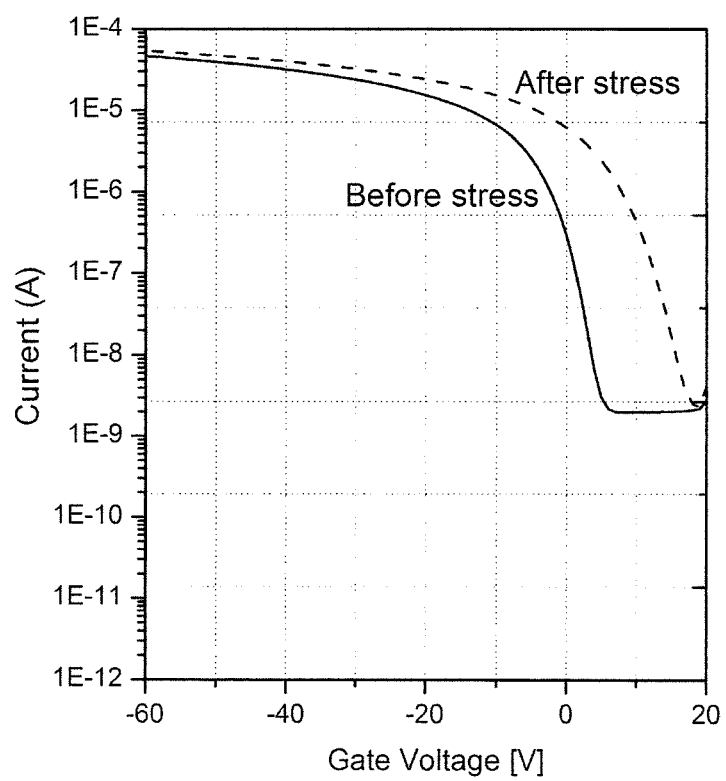
FIG. 7 is a transfer curve of the top gate OFET device of Comparison Example 2.

The transfer characteristics are shown in FIG. 7.

EXAMPLE 2

Top Gate OFET Device with a Melinex® Film Covered by a Polynorbornene Planarization Layer According to the Invention as Substrate Melinex ST506® film (available from DuPont Teijin Films™) was washed in methanol. A layer of the norbornene polymer pBuDMMINB (17.5% TS in MAK with added 0.5% 1-chloro-4-propoxy-9H-thioxanthen-9-one w/w) was deposited onto the Melinex film via spin coating (1500 rpm, 30 s) followed by 8 min baking at 70° C. and 4 min UV exposure (UVA 0.011 W/cm2, peak at 365 nm).

Approximately 60 nm thick gold source drain electrodes were evaporated onto the polynorbornene layer with a parallel plate geometry of 20 μm wide by 1 mm long.

The electrodes were treated with Lisicon M001® (available from Merck Chemicals Ltd.) by spin coating from isopropyl alcohol and evaporating the excess off on a hot plate at 70° C. for 2 min.

The same OSC Lisicon S1200-Series® formulation as used in Comparison Example 1 was then printed as a 5×5 cm wide area block on the array of source/drain electrodes on the film as described above using a RK Flexiproof 100 flexographic printing with a 8 cm$^3$/m$^2$ loaded anilox and a Cyrel HiQS flexo mat running at 70 m/min speed. The printed OSC layer was then annealed at 70° C. for 5 min.

A dielectric layer of fluoro-polymer Lisicon D139® (9% solids available from Merck Chemicals Ltd.) was spun on top of the OSC layer on the device and annealed at 70° C. for 8 min to give a dry dielectric film of approximately 1 μm thick.

Finally a 40 nm thick gold gate electrode array is evaporated on top of the dielectric layer in such a way that it covered the existing source drain electrode structures.

The initial transfer curve was recorder at bias voltage of −5 V. Then the device was electrically stressed for 80 h using source/gate voltage of 30 V and the second transfer curve was recorded directly after the stress.

Figure 8:
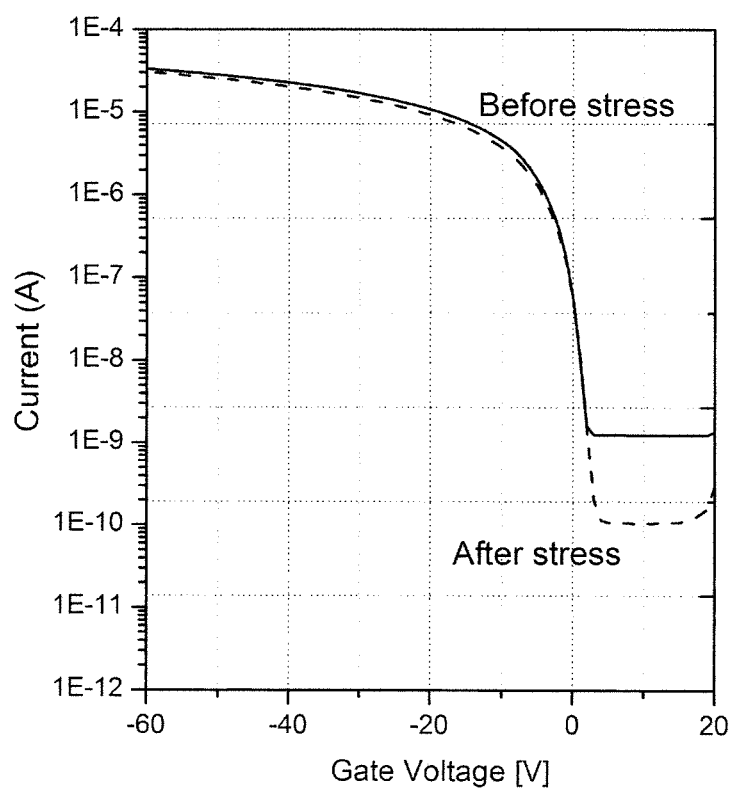
FIG. 8 is a transfer curve of the top gate OFET device of Example 2.

The transfer characteristics are shown in FIG. 8.

From FIG. 8 it can be seen that in the OFET device of Example 2, the layer of pDMMIBuNB on top of Melinex ST506® film improves stability of the electrical parameters, in comparison to the OFET device of Comparison Example 2 without the additional pDMMIBuNB layer (see FIG. 7). Stability of the source-drain current in the 'ON' state (under negative gate bias in case of using p-type semiconductors) and limited threshold voltage shift after application of positive gate bias stress (30V) are particularly important to ensure applicability of the transistors.

Such an improved long term stability of those parameters was observed for the devices containing the planarization layer of pDMMIBuNB, compared to devices without the layer of pDMMIBuNB.

The surface roughness of the substrates of Comparison Example 2 and Example 2 was measured by Atomic Force Microscope.

As a result the surface roughness of the Melinex ST506® substrate as used in Comparison Example 2 is 0.6 nm ($R_a$) and 20 nm ($R_t$), whereas the the surface roughness of the same substrate coated with a layer of pDMMIBuNB as used in Example 2, is 0.2 nm ($R_a$) and 5 nm ($R_t$) for pDMMI-BuNB layer.

This shows that the surface roughness was significantly reduced after application of the planarization layer of pDMMIBuNB.

Surface energy measurements using the Owens-Wendt method were carried out for the substrates of Comparison Example 2 and Example 2.

As a result the surface energy of the Melinex ST506® substrate as used in Comparison Example 2 is 33 mN/m, whereas the the surface energy of the same substrate coated with a layer of pDMMIBuNB as used in Example 2, is 50 mN/m respectively.

Since de-wetting may occur at low surface energies <40 mN/m, the substrate of Comparison Example 2 needs further plasma treatment to increase surface energy. In contrast thereto, a surface modification of the pDMMIBuNB layer prior to the OSC deposition, for example in order to improve surface energy and wetting, is not required. Nevertheless, pDMMIBuNB is resistant to plasma treatment, which is commonly applied after a photolithographic process in order to remove post-process residues.

The adhesion of Au gold to the substrates of Comparison Example 2 and Example 2 was measured by Mecmesin MultiTest 1-i (50 N cell) using 90° peel test. For that purpose both substrates were covered by approximately 60 nm layers of gold and 25 mm wide tape with 20 N adhesion to gold was applied to peel a stripe of gold from the substrates.

As a result the adhesion of gold to the Melinex ST506® substrate as used in Comparison Example 2 is less or equal to 0.5N whereas the adhesion of gold to the same substrate coated with a layer of pDMMIBuNB as used in Example 2, is 16 N.

EXAMPLE 3

Top Gate OFET Device with a Melinex® Film Covered by a Polynorbornene Planarization Layer According to the Invention as Substrate Melinex ST506® film (available from DuPont Teijin Films™) was washed in methanol. A layer of the norbornene polymer poly(DMMIBuNB/TESNB) which is a co-polymer of the monomer DMMIBuNB of the formula (37) and the monomer TESNB of the formula (53) in the ratio: 9:1, dissolved in MAK to the concentration of 17.5% TS) was deposited onto the Melinex film via spin coating (1500 rpm, 30 s) followed by 8 min baking at 70° C. and 5 min UV exposure (UVA 0.011 W/cm$^2$, peak at 365 nm).

Approximately 60 nm thick gold source drain electrodes were evaporated onto the polynorbornene layer with a parallel plate geometry of 20 μm wide by 1 mm long.

The electrodes were treated with Lisicon M001® (available from Merck Chemicals Ltd.) by spin coating from isopropyl alcohol and evaporating the excess off on a hot plate at 70° C. for 2 min.

The same OSC Lisicon S1200-Series® formulation as used in Comparison Example 1 was then printed as a 5×5 cm wide area block on the array of source/drain electrodes on the film as described above using a RK Flexiproof 100 flexographic printing with a 8 cm$^3$/m$^2$ loaded anilox and a Cyrel HiQS flexo mat running at 70 m/min speed. The printed OSC layer was then annealed at 70° C. for 5 min.

A dielectric layer of fluoro-polymer Lisicon D139® (9% solids available from Merck Chemicals Ltd.) was spun on top of the OSC layer on the device and annealed at 70° C. for 8 min to give a dry dielectric film of approximately 1 μm thick.

Finally a 40 nm thick gold gate electrode array is evaporated on top of the dielectric layer in such a way that it covered the existing source drain electrode structures.

The initial transfer curve was recorder at bias voltage of −5 V. Then the device was electrically stressed for 80 h using source/gate voltage of 30 V and the second transfer curve was recorded directly after the stress.

Figure 9:
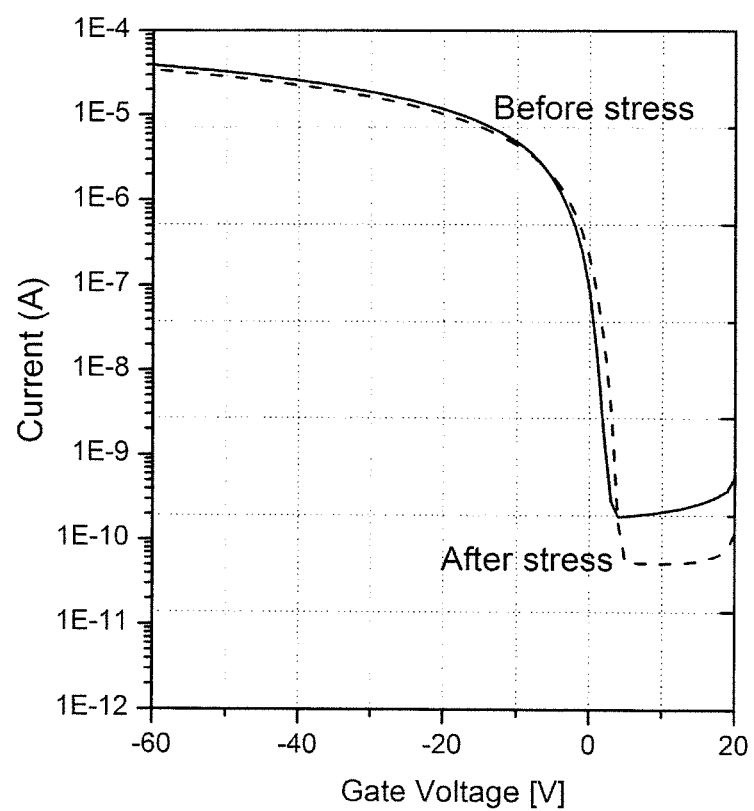
FIG. 9 is a transfer curve of the top gate OFET device of Example 3.

The transfer characteristics are shown in FIG. 9.

From FIG. 9 it can be seen that in the OFET device of Example 3, the layer of poly(DMMIBuNB/TESNB) on top of Melinex ST506® film improves stability of the electrical parameters, in comparison to the OFET device of Comparison Example 3 without the additional poly(DMMIBuNB/TESNB) layer (see FIG. 7). Stability of the source-drain current in the 'ON' state (under negative gate bias in case of using p-type semiconductors) and limited threshold voltage shift after application of positive gate bias stress (30V) are particularly important to ensure applicability of the transistors.

Such an improved long term stability of those parameters was observed for the devices containing the planarization layer of poly(DMMIBuNB/TESNB), compared to devices without the layer of poly(DMMIBuNB/TESNB).

Furthermore, the OFET device of Example 3 shows a decreased source-drain current in the 'OFF' state (under positive gate bias in case of using p-type semiconductors) by over one order of magnitude for non-patterned OSC layer (where OSC layer covers the whole area of a substrate and there is significant current leakage between the neighboring devices through the OSC layer).

The surface roughness of the substrates of Comparison Example 2 and Example 3 was measured by Atomic Force Microscopy.

As a result the surface roughness of the Melinex ST506® substrate as used in Comparison Example 2 (without plasma treatment) is 0.6 nm ($R_a$) and 20 nm ($R_t$), whereas the the surface roughness of the same substrate coated with a layer of poly(DMMIBuNB/TESNB) as used in Example 3, is 0.2 nm ($R_a$) and 5 nm ($R_t$) for poly(DMMIBuNB/TESNB) layer.

This shows that the surface roughness was significantly reduced after application of the planarization layer of poly (DMMIBuNB/TESNB).

Surface energy measurements using the Owens-Wendt method were carried out for the substrates of Comparison Example 2 and Example 3.

As a result the surface energy of the Melinex ST506® substrate as used in Comparison Example 2 is 33 mN/m, whereas the the surface energy of the same substrate coated with a layer of poly(DMMIBuNB/TESNB) as used in Example 3, is 51 mN/m respectively.

Since de-wetting may occur at low surface energies <40 mN/m, the substrate of Comparison Example 2 needs further plasma treatment to increase surface energy. In contrast thereto, a surface modification of the poly(DMMIBuNB/TESNB) layer prior to the OSC deposition, for example in order to improve surface energy and wetting, is not required. Nevertheless, poly(DMMIBuNB/TESNB) is resistant to plasma treatment, which is commonly applied after a photolithographic process in order to remove post-process residues.

The adhesion of Au gold to the substrates of Comparison Example 2 and Example 3 was measured by Mecmesin MultiTest 1-i (50 N cell) using 90° peel test. For that purpose both substrates were covered by approximately 60 nm layers of gold and 25 mm wide tape with 20 N adhesion to gold was applied to peel a stripe of gold from the substrates.

As a result the adhesion of gold to the Melinex ST506® substrate as used in Comparison Example 2 is less or equal to 0.5N, whereas the adhesion of gold to the same substrate coated with a layer of poly(DMMIBuNB/TESNB) as used in Example 2, is >20 N.

The results of Example 1, 2 and 3 demonstrate that a substrate coated with a polynorbornene planarization layer provides largely improved stability of OFETs compared to a prior art substrate as used in Comparison Example 2, which is considered as a benchmark. Low surface roughness and high surface energy of polynorbornene layers are also beneficial for simplification of the OFET manufacturing process. Additionally, specific substituents, on the polynorbornene backbone, like triethoxysilyl (TESS) as in formula (53), provide large increase of adhesion to metals like gold, which eliminate the need for additional adhesion layers between the planarization materials and the electrodes.

All the references described above are incorporated by reference into this application.

The invention claimed is:

1. An organic electronic device comprising a substrate having a planarization layer disposed directly on the substrate, and provided on said substrate a functional layer selected from semiconducting layers, dielectric layers, and electrodes, wherein the planarization layer is positioned between the substrate and the functional layer, wherein said planarization layer comprises a polycycloolefinic polymer.

2. The organic electronic device of claim 1, wherein the polycycloolefinic polymer is a norbornene-type polymer.

3. The organic electronic device of claim 1, wherein the polycycloolefinic polymer comprises two or more distinct types of repeating units.

4. The organic electronic device of claim 3, wherein one of the two or more distinct repeating units includes a pendant crosslinkable group.

5. The organic electronic device of claim 4, wherein the pendant crosslinkable group is a latent crosslinkable group.

6. The organic electronic device of claim 5, wherein the pendant crosslinkable group comprises a substituted or unsubstituted maleimide portion, an epoxide portion, a vinyl portion, an acetylene portion, an indenyl portion, a cinnamate portion or a coumarin portion.

7. The organic electronic device of claim 6, wherein the repeating unit having a pendant crosslinkable group is derived during polymerization from one of the following monomers:

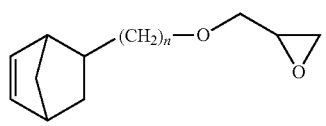
P1

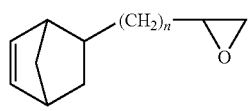
P2

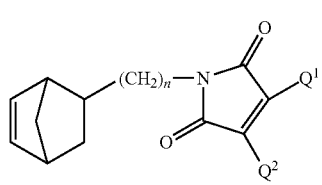
P3

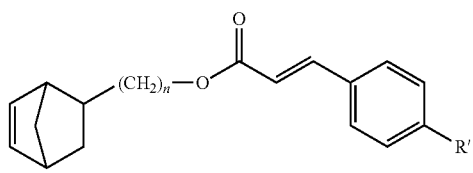
P4

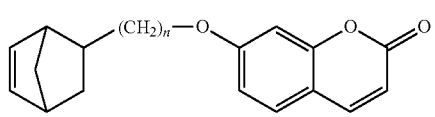
P5 where n is an integer from 1 to 8, $Q^1$ and $Q^2$ are each independently selected from —H or —CH$_3$, and R' in P4 is —H or —OCH$_3$.

8. The organic electronic device of claim 4, wherein the polycycloolefinic polymer comprises a second type of repeating unit having a pendant silyl group.

9. The organic electronic device of claim 1, wherein the polycycloolefinic polymer comprises one or more distinct types of repeating units represented by formula I

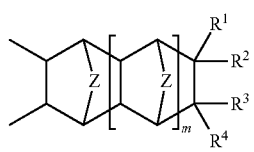
(I)

wherein Z is selected from —CH$_2$—, —CH$_2$—CH$_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group.

10. The organic electronic device of claim 9, wherein the one or more distinct types of repeating units is formed from norbornene-type monomers independently selected from the following formulae:

NBC$_4$F$_9$
15

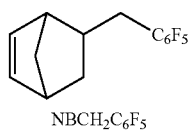
NBCH$_2$C$_6$F$_5$
16

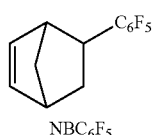
NBC$_6$F$_5$
17

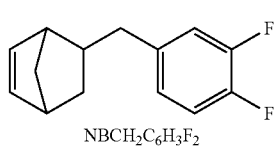
NBCH$_2$C$_6$H$_3$F$_2$
18

-continued

NBCH₂C₆H₄CF₃

NBalkylC₆F₅ wherein b is an integer from 1 to 6.

11. The organic electronic device of claim 9, wherein the one or more distinct types of repeating units is formed from norbornene-type monomers independently selected from the following formulae:

DMMIMeNB

DMMIEtNB

DMMIPrNB

DMMIBuNB

DMMIHxNB

12. The organic electronic device of claim 9, wherein the one or more distinct types of repeating units is formed from norbornene-type monomers independently selected from the following formulae:

TESNB

TMSNB

13. The organic electronic device of claim 1, wherein the planarization layer comprises two or more polycycloolefinic polymers having one or more distinct types of repeating units of formula I $$\begin{array}{c}(I)\end{array}$$

wherein Z is selected from —CH₂—, —CH₂—CH₂— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group.

14. The organic electronic device of claim 1, wherein the planarization layer is derived from a polymer composition, said composition comprising one or more of a solvent, a crosslinking agent, an optional reactive solvent, a stabilizer, a UV sensitizer, an adhesion promoter, and a thermal sensitizer.

15. The organic electronic device of claim 14, wherein the polymer composition comprises a compound selected of formula III1 or III2

P-A"-X'-A"-P      III1

$H_{4-c}C(A''-P)_c$      III2 wherein X' is O, S, NH or a single bond, A" is a single bond or a connecting, spacer or bridging group selected from $(CZ_2)_n$, $(CH_2)_p$—(CH=CH)$_p$—(CH$_2)_n$, $(CH_2)_n$—O—(CH$_2)_n$, $(CH_2)_n$—$C_6Q_{10}$-(CH$_2)_n$, and C(O), where each n is independently an integer from 0 to 12, p is an integer from 1-6, Z is independently H or F, $C_6Q_{10}$ is cyclohexyl that is substituted with Q, Q is independently H, F, CH₃, CF₃ or OCH₃, P is a latent crosslinkable group, and c is 2, 3 or 4, and where in formula III1 at least one of X' and the two groups A" is not a single bond.

16. The organic electronic device of claim 15, wherein the compound of formula III1 is selected of formula C1:

C1 wherein $R^{10}$ and $R^{11}$ are independently of each other H or a $C_1$-$C_6$ alkyl group and A" is as defined in claim 15.

17. The organic electronic device of claim 14, wherein the polymer composition comprises a compound of formula IV

G-A"-P    IV wherein G is a surface-active group of the formula —SiR$^{12}$R$^{13}$R$^{14}$, or a group of the formula —NH—SiR$^{12}$R$^{13}$R$^{14}$, wherein R$^{12}$, R$^{13}$ and R$^{14}$ are each independently selected from halogen, silazane, $C_1$-$C_{12}$-alkoxy, $C_1$-$C_{12}$-alkylamino, optionally substituted $C_5$-$C_{20}$-aryloxy and optionally substituted $C_2$-$C_{20}$-heteroaryloxy, and wherein one or two of R$^{12}$, R$^{13}$ and R$^{14}$ may also denote $C_1$-$C_{12}$-alkyl, optionally substituted $C_5$-$C_{20}$-aryl or optionally substituted $C_2$-$C_{20}$-heteroaryl, P is a crosslinkable group selected from a maleimide, a 3-monoalkyl-maleimide, a 3,4-dialkylmaleimide, an epoxy, a vinyl, an acetylene, an indenyl, a cinnamate or a coumarin group, or comprises a substituted or unsubstituted maleimide portion, an epoxide portion, a vinyl portion, an acetylene portion, an indenyl portion, a cinnamate portion or a coumarin portion, and A" is a single bond or a connecting, spacer or bridging group selected from $(CZ_2)_n$, $(CH_2)_n$—(CH=CH)$_p$—$(CH_2)_n$, $(CH_2)_n$—O, $(CH_2)_n$—O—$(CH_2)_n$, $(CH_2)_n$—$C_6Q_4$-$(CH_2)_n$, $(CH_2)_n$—$C_6Q_{10}$-$(CH_2)_n$ and C(O)—O, where each n is independently an integer from 0 to 12, p is an integer from 1-6, Z is independently H or F, $C_6Q_4$ is phenyl that is substituted with Q, $C_6Q_{10}$ is cyclohexyl that is substituted with Q, Q is independently H, F, $CH_3$, $CF_3$ or $OCH_3$.

18. The organic electronic device of claim 17, wherein the compound of formula IV is selected of formula A1:

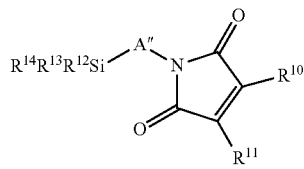

A1 where R$^{12}$, R$^{13}$, R$^{14}$, and A" are as defined in claim 17, and R$^{10}$ and R$^{11}$ are each independently H or a $C_1$-$C_6$ alkyl group.

19. The organic electronic device of claim 1, wherein the substrate is a polyester film.

20. The organic electronic device of claim 19, wherein the substrate is a polyethyleneterephthalate (PET) or polyethylenenaphthalate (PEN) film.

21. The organic electronic device of claim 1, wherein an electrode is formed on the planarization layer.

22. The organic electronic device of claim 1, wherein an organic semiconductor layer is formed on the planarization layer.

23. The organic electronic device of claim 1, wherein a dielectric layer is formed on the planarization layer.

24. The organic electronic device of claim 1, which is an Organic Field Effect Transistor (OFET), Organic Photovoltaic (OPV) Device, or Organic Sensor.

25. The organic electronic device of claim 24, which is a top gate OFET or a bottom gate OFET.

26. A product or assembly comprising an organic electronic device of claim 1, which is an Integrated Circuit (IC), a Radio Frequency Identification (RFID) tag, a security marking or security device containing an RFID tag, a Flat Panel Display (FPD), a backplane of an FPD, or a sensor.

27. A process for preparing a top gate OFET, the process comprising:
a) depositing a layer of planarization material, which comprises a polycycloolefinic polymer on a substrate,
b) forming source and drain electrodes on at least a portion of the planarization layer,
c) depositing a layer of organic semiconductor material over said planarization layer and the source and drain electrodes,
d) depositing a layer of dielectric material on the organic semiconductor layer,
e) forming a gate electrode on at least a portion of the dielectric layer and
f) optionally depositing a layer selected from an insulating, protection, stabilizing, and/or adhesive layer, on the gate electrode and portions of the dielectric layer.

28. A process for preparing a bottom gate OFET, the process comprising:
a) depositing a layer of planarization material, which comprises a polycycloolefinic polymer on a substrate,
b) forming a gate electrode on at least a portion of the planarization layer,
c) depositing a layer of dielectric material over said planarization layer and the gate electrode,
d) depositing a layer of organic semiconductor material) on dielectric layer,
e) forming source and drain electrodes on at least a portion of organic semiconductor layers as depicted, and
f) optionally depositing a layer selected from an insulating, protection, stabilizing, and/or adhesive layer, on the source and drain electrodes and portions of the organic semiconductor layer.

* * * * *